US012688879B2

(12) United States Patent
Saenz

(10) Patent No.: US 12,688,879 B2
(45) Date of Patent: Jul. 21, 2026

(54) APPARATUS AND METHODS FOR MANAGING SELECTOR DEVICE THRESHOLD VOLTAGE DRIFT

(71) Applicant: Sandisk Technologies, Inc., Milpitas, CA (US)

(72) Inventor: Juan P. Saenz, Menlo Park, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 49 days.

(21) Appl. No.: 18/389,987

(22) Filed: Dec. 20, 2023

(65) Prior Publication Data

US 2025/0210084 A1      Jun. 26, 2025

(51) Int. Cl.
*G11C 11/00* (2006.01)
*G11C 11/16* (2006.01)

(52) U.S. Cl.
CPC ...... *G11C 11/1659* (2013.01); *G11C 11/1673* (2013.01)

(58) Field of Classification Search
CPC .................. G11C 11/1659; G11C 11/1673
See application file for complete search history.

(56) References Cited

U.S. PATENT DOCUMENTS

| | | | |
|---|---|---|---|
| 8,194,433 | B2 | 6/2012 | Parkinson |
| 9,312,002 | B2 | 4/2016 | Navon |
| 9,406,351 | B2 | 8/2016 | Stansfield |
| 9,613,691 | B2 | 4/2017 | Mantegazza et al. |
| 9,627,055 | B1 | 4/2017 | Robustelli |
| 10,020,052 | B2 | 7/2018 | Kwon |
| 10,079,056 | B2 | 9/2018 | Gupta |
| 10,699,761 | B2 | 6/2020 | Berger |
| 10,777,275 | B2 | 9/2020 | Pirovano et al. |
| 10,867,672 | B2 | 12/2020 | Cho et al. |
| 11,195,579 | B2 | 12/2021 | Fantini et al. |
| 11,217,322 | B2 | 1/2022 | Tortorelli et al. |
| 11,222,678 | B1 | 1/2022 | Parkinson et al. |
| 11,398,262 | B1 | 7/2022 | Tran et al. |
| 11,501,831 | B2 | 11/2022 | Robertson et al. |
| 11,526,285 | B2 | 12/2022 | Wang |

(Continued)

FOREIGN PATENT DOCUMENTS

| | | |
|---|---|---|
| EP | 3772064 | 2/2021 |
| WO | WO 2018/004836 | 1/2018 |

OTHER PUBLICATIONS

U.S. Appl. No. 18/389,960, filed Dec. 20, 2023.

(Continued)

*Primary Examiner* — Pho M Luu
(74) *Attorney, Agent, or Firm* — PEARL COHEN ZEDEK LATZER BARATZ LLP

(57)      ABSTRACT

An apparatus is provided that includes a memory cell and a control circuit coupled to the memory cell. The memory cell includes a reversible resistance-switching memory element coupled in series with a selector element that comprises a threshold voltage. The control circuit is configured to use a first pulse comprising a first polarity to first access the memory cell, and use a second pulse comprising a second polarity opposite the first polarity to second access the memory cell and read the memory cell, the second pulse abutting the first pulse. The first pulse is configured to reduce a rate of threshold voltage drift of the selector element.

19 Claims, 24 Drawing Sheets

(56)        References Cited

U.S. PATENT DOCUMENTS

| 2006/0198184 | A1* | 9/2006 | Yoda | G11C 11/16 |
| | | | | 365/171 |
| 2013/0135925 | A1 | 5/2013 | Scheuerlein | |
| 2016/0180911 | A1 | 6/2016 | Schneider | |
| 2016/0284399 | A1 | 9/2016 | Mantegazza et al. | |
| 2016/0372193 | A1 | 12/2016 | Kripanidhi et al. | |
| 2018/0277187 | A1 | 9/2018 | Ikegami et al. | |
| 2019/0206506 | A1 | 7/2019 | Tortorelli | |
| 2020/0273512 | A1* | 8/2020 | Petti | G11C 11/1693 |
| 2021/0249073 | A1 | 8/2021 | Grobis | |
| 2022/0068391 | A1 | 3/2022 | Tortorelli et al. | |
| 2022/0238157 | A1 | 7/2022 | Giduturi | |
| 2022/0359005 | A1 | 11/2022 | Tortorelli et al. | |
| 2022/0415394 | A1 | 12/2022 | Wang et al. | |
| 2022/0415425 | A1 | 12/2022 | Rao et al. | |
| 2023/0101414 | A1 | 3/2023 | Hassner et al. | |
| 2023/0207037 | A1 | 6/2023 | Lu et al. | |
| 2024/0321371 | A1* | 9/2024 | Bozdag | G11C 11/1675 |

OTHER PUBLICATIONS

U.S. Appl. No. 18/389,980, filed Dec. 20, 2023.
Office Action from U.S. Appl. No. 18/389,960 dated Jun. 27, 2025.
Office Action for U.S. Appl. No. 18/389,980 dated Oct. 7, 2025.
Office Action for U.S. Appl. No. 18/389,980 dated May 26, 2026.

* cited by examiner

Memory Bay 170

Read/Write
Circuits 184

| Column Decoder 180 | | Column Decoder 190 |
|---|---|---|

| 178 | | 172 | | 188 |
|---|---|---|---|---|
| Row Decoder | Memory Array 174 | Row Decoder | Memory Array 176 | Row Decoder |

| Column Decoder 182 | | Column Decoder 192 |
|---|---|---|

Read/Write
Circuits 186

FIG. 1F

Voltage

Voltage

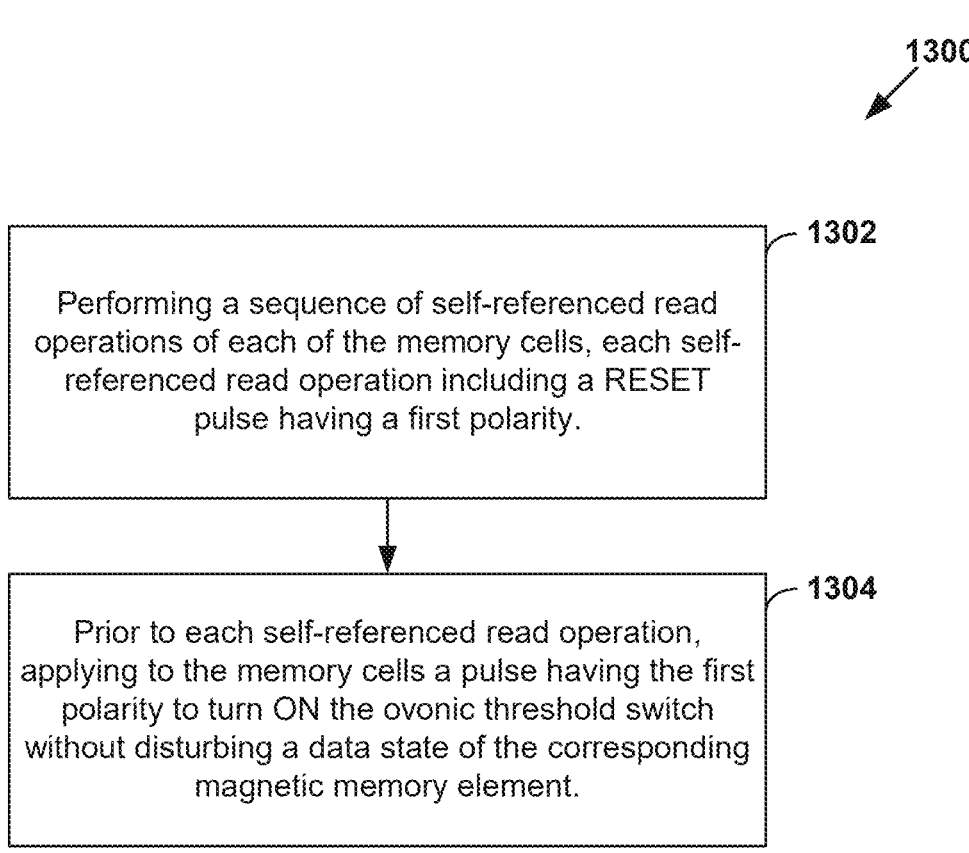

1300

1302

Performing a sequence of self-referenced read operations of each of the memory cells, each self-referenced read operation including a RESET pulse having a first polarity.

1304

Prior to each self-referenced read operation, applying to the memory cells a pulse having the first polarity to turn ON the ovonic threshold switch without disturbing a data state of the corresponding magnetic memory element.

FIG. 13

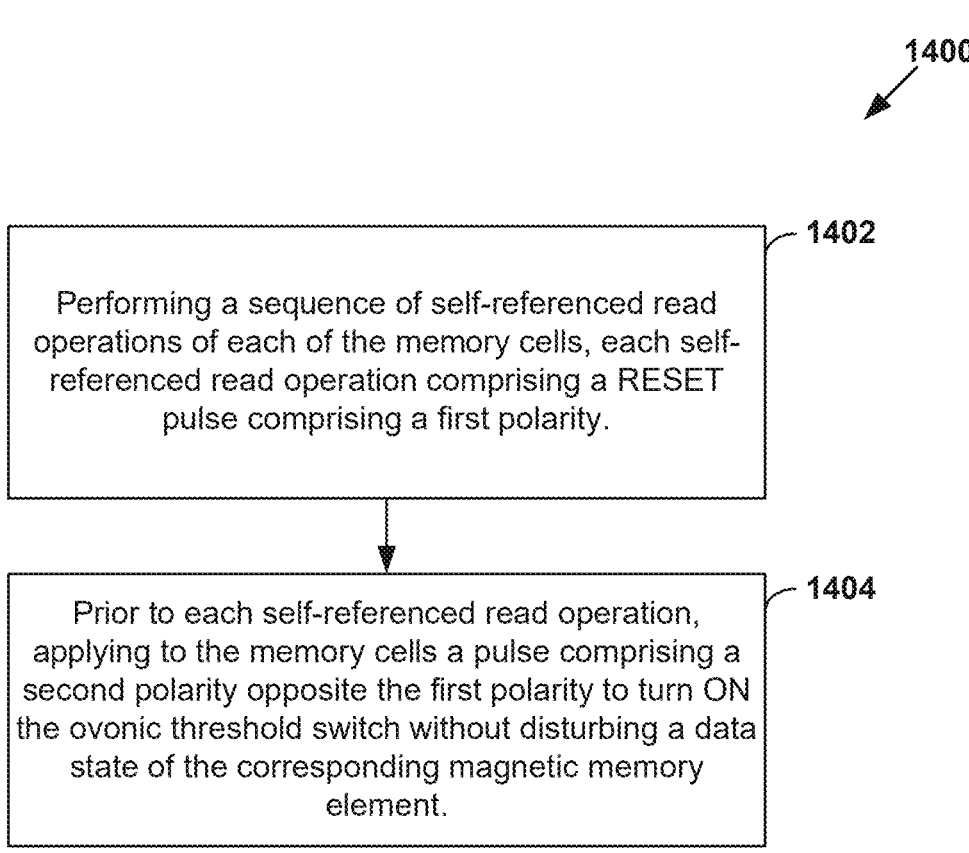

1400

1402

Performing a sequence of self-referenced read operations of each of the memory cells, each self-referenced read operation comprising a RESET pulse comprising a first polarity.

1404

Prior to each self-referenced read operation, applying to the memory cells a pulse comprising a second polarity opposite the first polarity to turn ON the ovonic threshold switch without disturbing a data state of the corresponding magnetic memory element.

FIG. 14

APPARATUS AND METHODS FOR MANAGING SELECTOR DEVICE THRESHOLD VOLTAGE DRIFT

BACKGROUND

Memory is widely used in various electronic devices such as cellular telephones, digital cameras, personal digital assistants, medical electronics, mobile computing devices, non-mobile computing devices and data servers. Memory may be non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that store data using electronic charge. Generally, MRAM includes a large number of magnetic memory cells formed on a semiconductor substrate, where each memory cell represents one bit of data.

A data bit is written to a memory cell by changing the direction of magnetization of a magnetic element within the memory cell, and a bit is read by measuring the resistance of the memory cell (low resistance typically represents a "0" bit, and high resistance typically represents a "1" bit). As used herein, direction of magnetization is the direction of orientation of the magnetic moment. Some memory cells may include a selector device, such as an ovonic threshold switch or other selector device.

Although MRAM is a promising technology, numerous design and process challenges remain.

BRIEF DESCRIPTION OF THE DRAWINGS

FIGS. 1A-1H depict various embodiments of a memory system.

FIG. 13 is a flow chart of another embodiment of a method for determining a bit error rate of a plurality of memory cells.

FIG. 14 is a flow chart of still another embodiment of a method for determining a bit error rate of a plurality of memory cells.

DETAILED DESCRIPTION

Figure 1A:
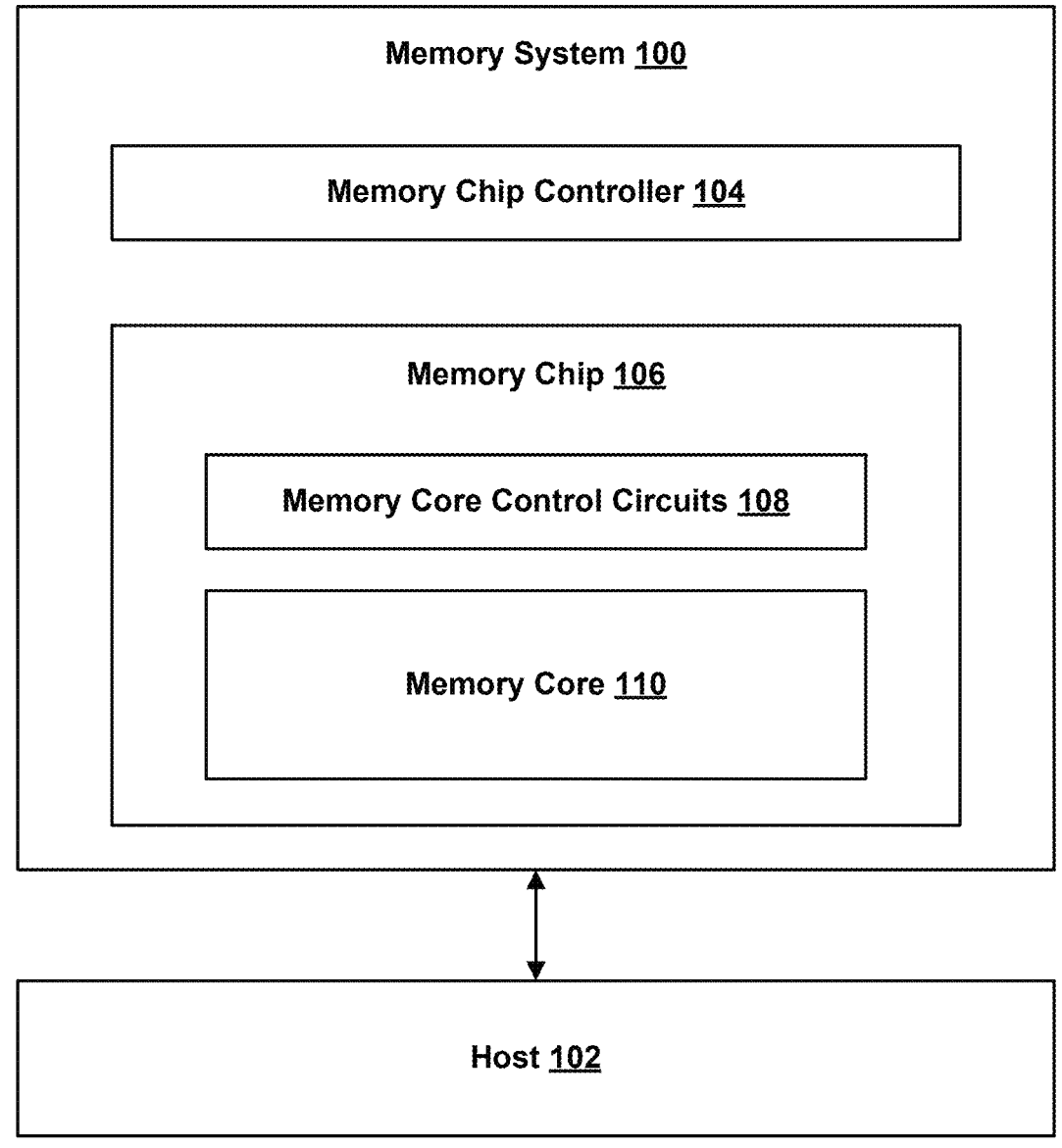

Technology is described for managing threshold voltage drift in memory cells that include a memory element coupled in series with a selector device. In some embodiments, the memory cells may include a threshold selector device, such as an ovonic threshold switch, that has a threshold voltage that varies with time after the threshold selector device is accessed. In some embodiments, the memory cells may include a threshold selector device, such as an ovonic threshold switch, that has a threshold voltage that increases in magnitude (e.g., drifts higher) with time after the threshold selector device is accessed. In some embodiments, the memory cells may include a threshold selector device, such as an ovonic threshold switch, that has a threshold voltage that increases in magnitude after the threshold selector device is accessed using access pulses having opposite polarities. An effect of the threshold voltage drift and/or the threshold voltage magnitude increase is that the memory state of the memory elements may be disturbed during read operations, resulting in a bit error rate that increases with increasing bit access time.

In an embodiment, the threshold voltage drift is managed using a post-set pulse after each SET pulse that is applied to the memory cells. In an embodiment, the post set pulse turns ON and OFF the selector device and has a polarity opposite a polarity of the SET pulse.

In another embodiment, a pre-read pulse is used to turn ON and OFF the selector device shortly before each read access. In an embodiment, the pre-read pulse has a polarity that is the same as a polarity of the read access.

In still another embodiment, a polarity-switching bit access pulse is used to turn ON and OFF the selector device shortly before each read access. In an embodiment, the polarity-switching bit access pulse has a polarity that is opposite that of the read access.

In embodiment, the memory cells include a memory element coupled in series with a selector device. In an embodiment, the memory element is a magnetic memory element. In an embodiment, the memory element is a magnetic tunnel junction memory element. In an embodiment, the selector device is an ovonic threshold switch.

In an embodiment, memory cells within a memory array may include non-volatile memory cells including a reversible resistance-switching element. A reversible resistance-switching element may include a reversible resistivity-switching material having a resistivity that may be reversibly switched between two or more states.

In an embodiment, the reversible resistance-switching material may include a metal oxide, solid electrolyte, phase-change material, magnetic material, or other similar resistivity-switching material. Various metal oxides can be used, such as transition metal-oxides. Examples of metal-oxides include, but are not limited to, NiO, $Nb_2O_5$, $TiO_2$, $HfO_2$, $Al_2O_3$, $MgO_x$, $CrO_2$, VO, BN, $TaO_2$, $Ta_2O_3$, and AlN.

In an embodiment, non-volatile memory cells within a memory array include one-time programmable memory cells. In an embodiment, non-volatile memory cells within a memory array include re-writeable memory cells.

FIG. 1A depicts one embodiment of a memory system 100 and a host 102. Memory system 100 may include a non-volatile storage system interfacing with host 102 (e.g., a mobile computing device or a server). In some cases, memory system 100 may be embedded within host 102. As examples, memory system 100 may be a memory card, a solid-state drive (SSD) such a high density MLC SSD (e.g., 2-bits/cell or 3-bits/cell) or a high performance SLC SSD, or a hybrid HDD/SSD drive.

As depicted, memory system 100 includes a memory chip controller 104 and a memory chip 106. Memory chip 106 may include volatile memory and/or non-volatile memory. Although a single memory chip is depicted, memory system 100 may include more than one memory chip. Memory chip controller 104 may receive data and commands from host 102 and provide memory chip data to host 102.

Memory chip controller 104 may include one or more of control circuitry, state machines, page registers, SRAM, decoders, sense amplifiers, read/write circuits, and/or controllers, or any combination thereof, for controlling the operation of memory chip 106. The one or more control circuitry, state machines, page registers, SRAM, decoders, sense amplifiers, read/write circuits, and/or controllers for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit or arranged on a single die. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells and/or one or more three-dimensional arrays of memory cells. In an embodiment, memory core may include re-writable memory cells, one-time programmable memory cells, and/or multi-time programmable memory cells, or any combination thereof.

In an embodiment, memory core control circuits 108 and memory core 110 may be arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 may send to memory chip controller 104 both a write command and the data to be written.

Memory chip controller 104 may buffer data to be written and may generate error correction code (ECC) data corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 may control operation of memory chip 106. In an example, before issuing a write operation to memory chip 106, memory chip controller 104 may check a status register to make sure that memory chip 106 is able to accept the data to be written.

In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested.

Once memory chip controller 104 initiates a read or write operation, memory core control circuits 108 may generate appropriate bias voltages and/or currents for word lines and bit lines within memory core 110, as well as generate the appropriate memory block, row, and column addresses.

Figure 1B:
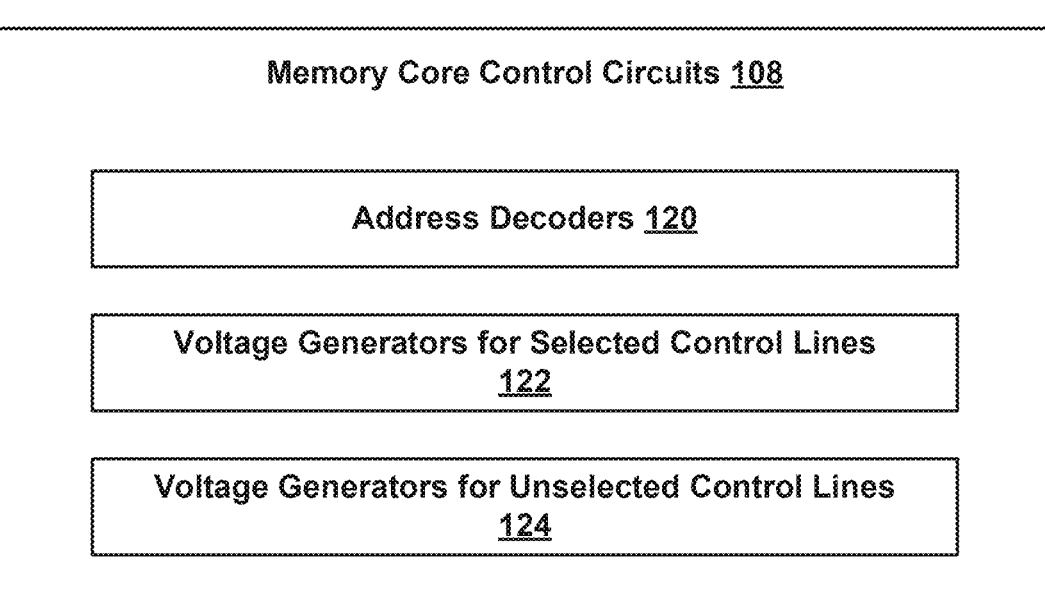

FIG. 1B depicts an embodiment of memory core control circuits 108. In an embodiment, memory core control circuits 108 include address decoders 120, voltage generators for selected control lines 122, and voltage generators for unselected control lines 124. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state.

Voltage generators (or voltage regulators) for selected control lines 122 may include one or more voltage generators for generating selected control line voltages. Voltage generators for unselected control lines 124 may include one or more voltage generators for generating unselected control line voltages. Address decoders 120 may generate memory block addresses, as well as row addresses and column addresses for a particular memory block.

FIGS. 1C-1F depict one embodiment of a memory core organization that includes a memory core 110 having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
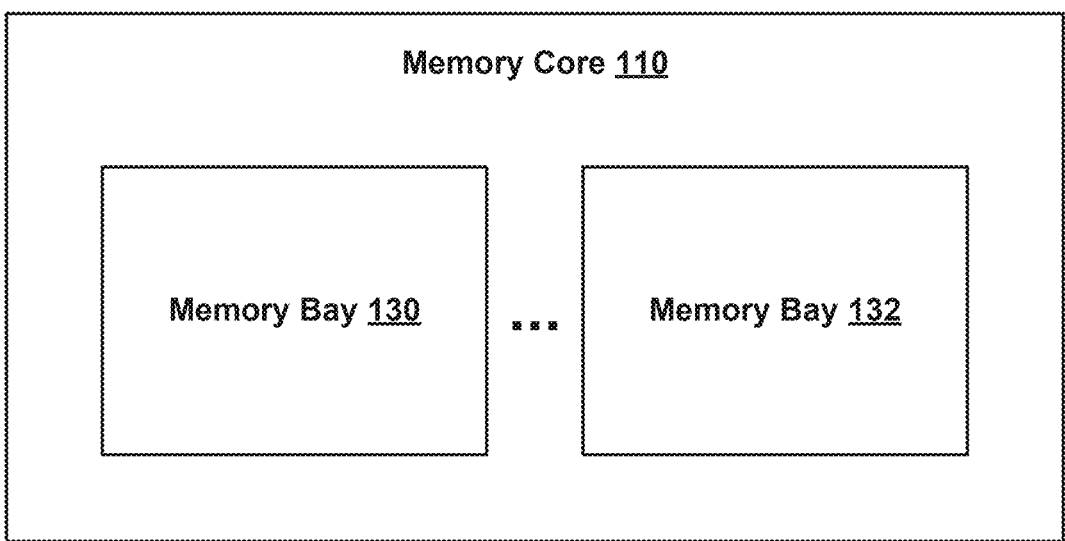

FIG. 1C depicts an embodiment of memory core 110 of FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 memory bays, 256 memory bays, etc.).

Figure 1D:
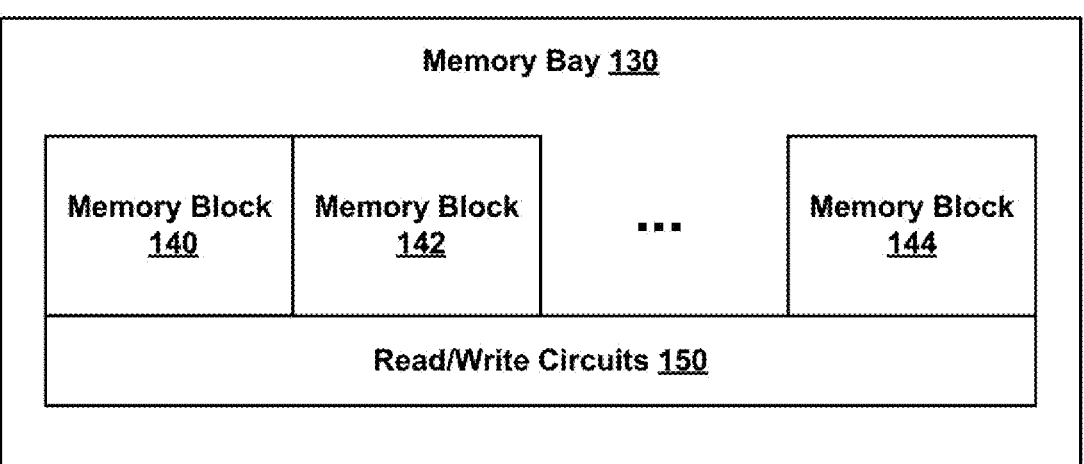

FIG. 1D depicts one embodiment of memory bay 130 of FIG. 1C. As depicted, memory bay 130 includes memory blocks 140-144 and read/write circuits 150. In some embodiments, the number of memory blocks per memory bay may be different for different implementations. For example, a memory bay may include one or more memory blocks (e.g., 32 memory blocks per memory bay).

Read/write circuits 150 include circuitry for reading and writing memory cells within memory blocks 140-144. As depicted, read/write circuits 150 may be shared across multiple memory blocks within a memory bay. This allows chip area to be reduced because a single group of read/write circuits 150 may be used to support multiple memory blocks. However, in some embodiments, only a single memory block may be electrically coupled to read/write circuits 150 at a particular time to avoid signal conflicts.

In some embodiments, read/write circuits 150 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In an example, memory system 100 of FIG. 1A may receive a write command including a target address and a set of data to be written to the target address. Memory system 100 may perform a read-before-write (RBW) operation to read the data currently stored at the target address before performing a write operation to write the set of data to the target address. Memory system 100 may then determine whether a particular memory cell may stay at its current state (i.e., the memory cell is already at the correct state), needs to be set to a "0" state, or needs to be reset to a "1" state.

Memory system 100 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells.

A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 150 may be used to program a particular memory cell to be in one of three or more data/resistance states (i.e., the particular memory cell may comprise a multi-level memory cell). In an example, read/write circuits 150 may apply a first voltage difference (e.g., 2V) across the particular memory cell to program the particular memory cell to a first state of the three or more data/resistance states, or a second voltage difference (e.g., 1V) across the particular memory cell that is less than the first voltage difference to program the particular memory cell to a second state of the three or more data/resistance states.

Applying a smaller voltage difference across the particular memory cell may cause the particular memory cell to be partially programmed or programmed at a slower rate than when applying a larger voltage difference. In another example, read/write circuits 150 may apply a first voltage difference across the particular memory cell for a first time period (e.g., 150 ns) to program the particular memory cell to a first state of the three or more data/resistance states, or apply the first voltage difference across the particular memory cell for a second time period less than the first time period (e.g., 50 ns). One or more programming pulses followed by a memory cell verification phase may be used to program the particular memory cell to be in the correct state.

Figure 1E:
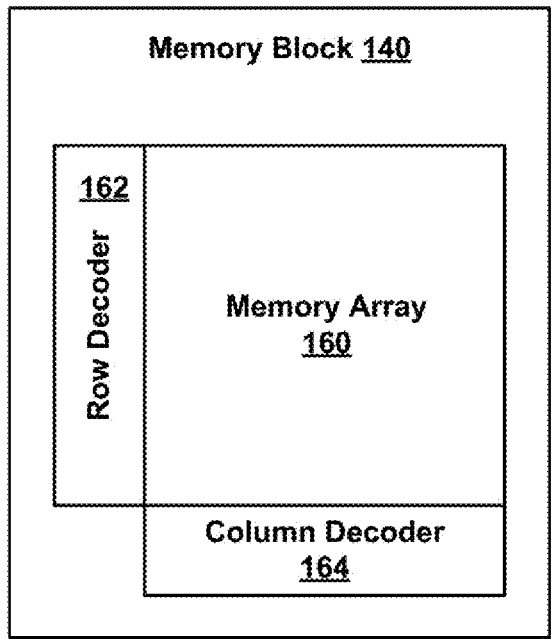

FIG. 1E depicts one embodiment of memory block 140 of FIG. 1D. As depicted, memory block 140 includes a memory array 160, a row decoder 162, and a column decoder 164. Memory array 160 may include a contiguous group of memory cells having contiguous word lines and bit lines. Memory array 160 may include one or more layers of memory cells, and may include a two-dimensional memory array and/or a three-dimensional memory array.

Row decoder 162 decodes a row address and selects a particular word line in memory array 160 when appropriate (e.g., when reading or writing memory cells in memory array 160). Column decoder 164 decodes a column address and selects a particular group of bit lines in memory array 160 to be electrically coupled to read/write circuits, such as read/write circuits 150 of FIG. 1D. In an embodiment, the number of word lines is 4K per memory layer, the number of bit lines is 1K per memory layer, and the number of memory layers is 4, providing a memory array 160 containing 16M memory cells. Other numbers of word lines per layer, bit lines per layer, and number of layers may be used.

FIG. 1F depicts an embodiment of a memory bay 170. Memory bay 170 is an example of an alternative implementation for memory bay 130 of FIG. 1D. In some embodiments, row decoders, column decoders, and read/write circuits may be split or shared between memory arrays. As depicted, row decoder 172 is shared between memory arrays 174 and 176, because row decoder 172 controls word lines in both memory arrays 174 and 176 (i.e., the word lines driven by row decoder 172 are shared).

Row decoders 178 and 172 may be split such that even word lines in memory array 174 are driven by row decoder 178 and odd word lines in memory array 174 are driven by row decoder 172. Column decoders 180 and 182 may be split such that even bit lines in memory array 174 are controlled by column decoder 182 and odd bit lines in memory array 174 are driven by column decoder 180.

The selected bit lines controlled by column decoder 180 may be electrically coupled to read/write circuits 184. The selected bit lines controlled by column decoder 182 may be electrically coupled to read/write circuits 186. Splitting the read/write circuits into read/write circuits 184 and 186 when the column decoders are split may allow for a more efficient layout of the memory bay.

Row decoders 188 and 172 may be split such that even word lines in memory array 176 are driven by row decoder 188 and odd word lines in memory array 176 are driven by row decoder 172. Column decoders 190 and 192 may be split such that even bit lines in memory array 176 are controlled by column decoder 192 and odd bit lines in memory array 176 are driven by column decoder 190.

The selected bit lines controlled by column decoder 190 may be electrically coupled to read/write circuits 184. The selected bit lines controlled by column decoder 192 may be electrically coupled to read/write circuits 186. Splitting the read/write circuits into read/write circuits 184 and 186 when the column decoders are split may allow for a more efficient layout of the memory bay.

Figure 1G:
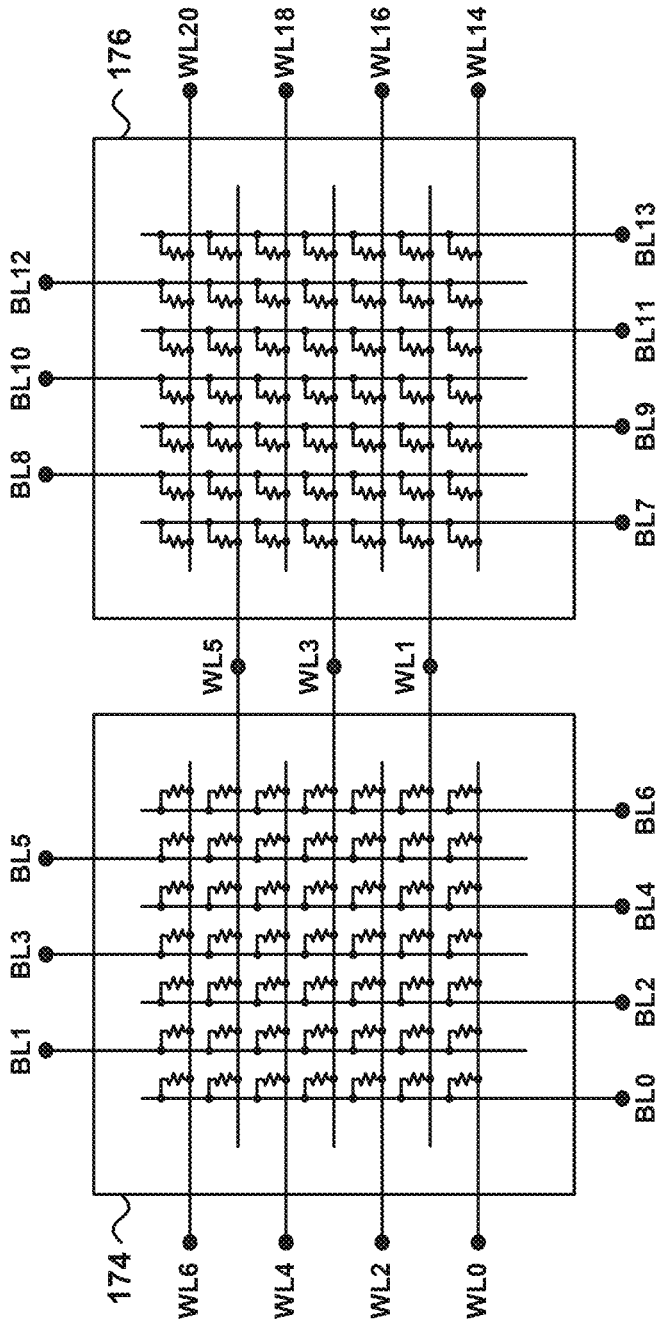

FIG. 1G depicts an embodiment of a schematic diagram (including word lines and bit lines) corresponding with memory bay 170 in FIG. 1F. As depicted, word lines WL1, WL3, and WL5 are shared between memory arrays 174 and 176 and controlled by row decoder 172 of FIG. 1F. Word lines WL0, WL2, WL4, and WL6 are driven from the left side of memory array 174 and controlled by row decoder 178 of FIG. 1F. Word lines WL14, WL16, WL18, and WL20 are driven from the right side of memory array 176 and controlled by row decoder 188 of FIG. 1F.

Bit lines BL0, BL2, BL4, and BL6 are driven from the bottom of memory array 174 and controlled by column decoder 182 of FIG. 1F. Bit lines BL1, BL3, and BL5 are driven from the top of memory array 174 and controlled by column decoder 180 of FIG. 1F. Bit lines BL7, BL9, BL11, and BL13 are driven from the bottom of memory array 176 and controlled by column decoder 192 of FIG. 1F. Bit lines BL8, BL10, and BL12 are driven from the top of memory array 176 and controlled by column decoder 190 of FIG. 1F.

In an embodiment, memory arrays 174 and 176 may include memory layers that are oriented in a plane that is horizontal to the supporting substrate. In another embodiment, memory arrays 174 and 176 may include memory layers that are oriented in a plane that is vertical with respect to the supporting substrate (i.e., the vertical plane is substantially perpendicular to the supporting substrate). In this case, the bit lines of the memory arrays may include substantially vertical bit lines.

Figure 1H:
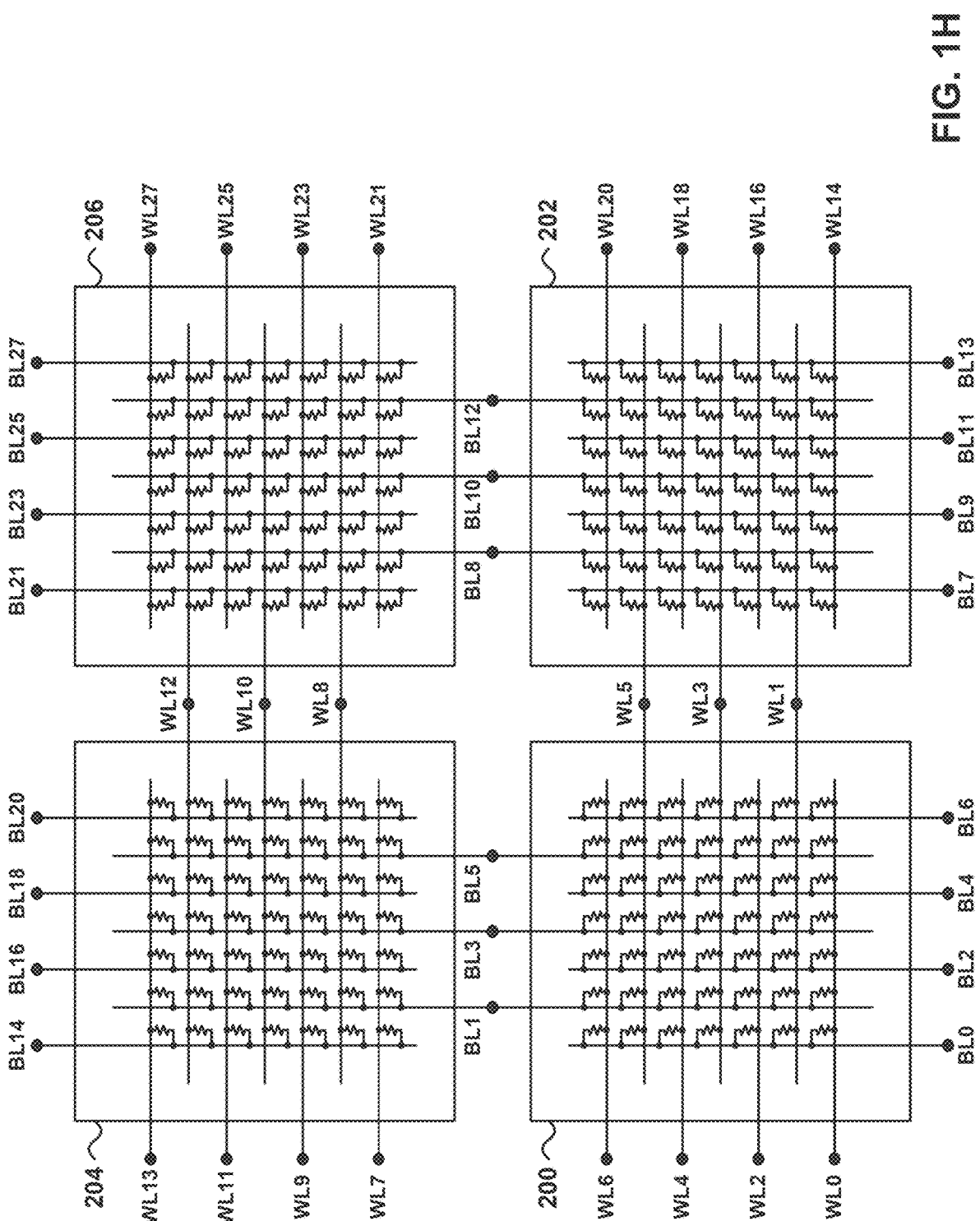

FIG. 1H depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area because a single row decoder and/or column decoder can be used to support two memory arrays.

As depicted, word lines WL1, WL3, and WL5 are shared between memory arrays 200 and 202. Bit lines BL1, BL3, and BL5 are shared between memory arrays 200 and 204. Word lines WL8, WL10, and WL12 are shared between memory arrays 204 and 206. Bit lines BL8, BL10, and BL12 are shared between memory arrays 202 and 206.

Row decoders are split such that word lines WL0, WL2, WL4, and WL6 are driven from the left side of memory array 200 and word lines WL1, WL3, and WL5 are driven from the right side of memory array 200. Likewise, word lines WL7, WL9, WL11, and WL13 are driven from the left side of memory array 204 and word lines WL8, WL10, and WL12 are driven from the right side of memory array 204.

Column decoders are split such that bit lines BL0, BL2, BL4, and BL6 are driven from the bottom of memory array 200 and bit lines BL1, BL3, and BL5 are driven from the top of memory array 200. Likewise, bit lines BL7, BL9, BL11, and BL13 are driven from the bottom of memory array 202 and bit lines BL8, BL10, and BL12 are driven from the top of memory array 202. Splitting row and/or column decoders also helps to relieve layout constraints (e.g., the column decoder pitch can be relieved by 2× since the split column decoders need only drive every other bit line instead of every bit line).

Figure 2A:
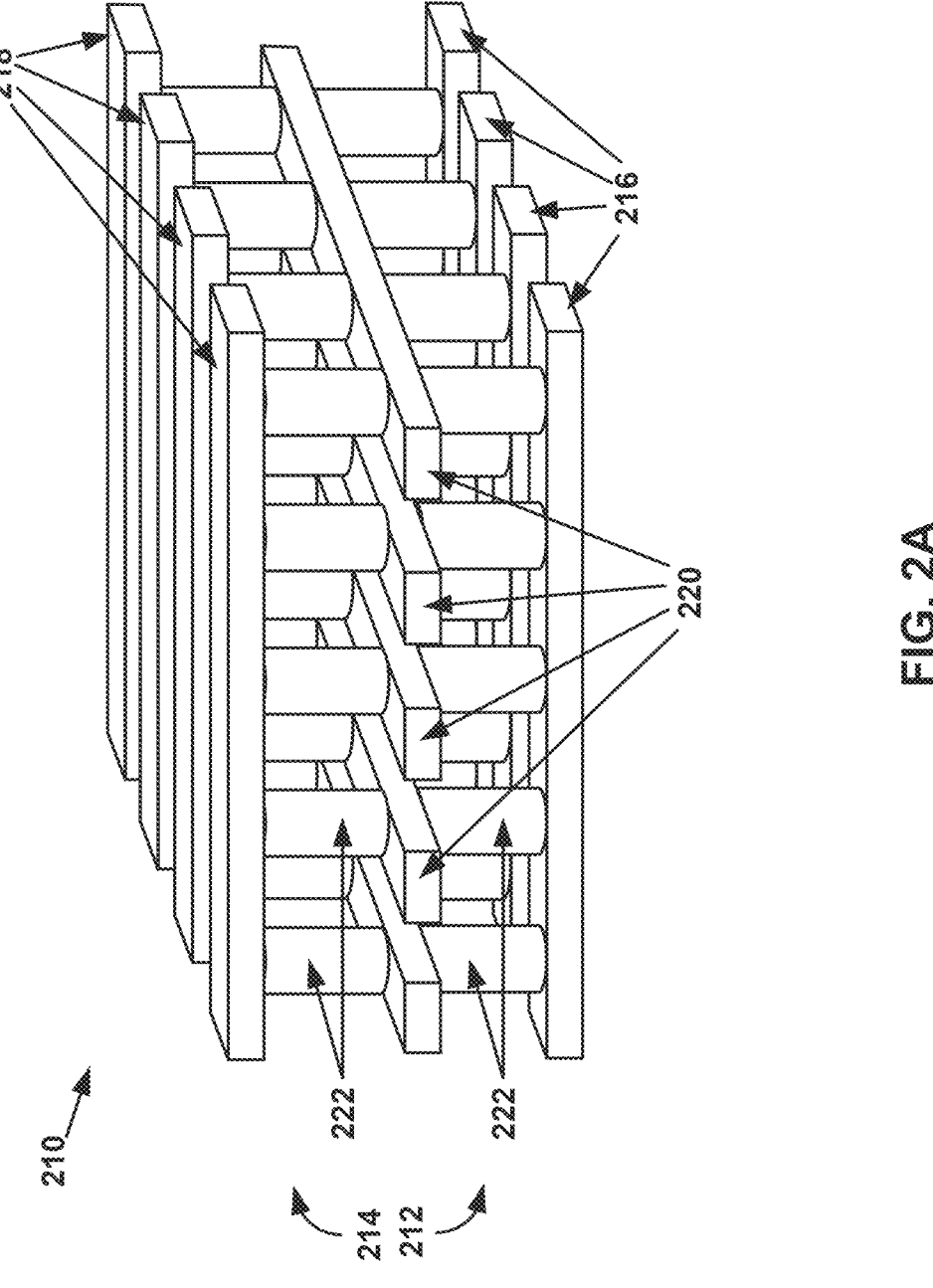
FIG. 2A depicts an embodiment of a portion of a three-dimensional memory array.

FIG. 2A depicts an embodiment of a portion of a monolithic three-dimensional memory array 210 that includes a first memory level 212, and a second memory level 214 positioned above first memory level 212. Memory array 210 is an example of an implementation of memory array 160 in FIG. 1E. Word lines 216 and 218 are arranged in a first direction and bit lines 220 are arranged in a second direction perpendicular to the first direction. As depicted, the upper conductors of first memory level 212 may be used as the lower conductors of second memory level 214. In a memory array with additional layers of memory cells, there would be corresponding additional layers of bit lines and word lines.

Memory array 210 includes a plurality of memory cells 222. In embodiments, memory cells 222 may include re-writeable memory cells, one-time programmable memory cells, and multi-time programmable memory cells. In an embodiment, each of memory cells 222 are vertically-oriented. Memory cells 222 may include non-volatile memory cells or volatile memory cells. With respect to first memory level 212, a first portion of memory cells 222 are between and connect to word lines 216 and bit lines 220. With respect to second memory level 214, a second portion of memory cells 222 are between and connect to word lines 218 and bit lines 220.

In an embodiment, each memory cell 222 includes a selector element coupled in series with a resistance-switching memory element, where each memory cell 222 represents one bit of data. In an embodiment, the resistance-switching memory element may be a magnetic memory element, a ReRAM memory element, a phase change memory element or other type of resistance-switching memory element.

In an embodiment, each memory cell 222 includes a selector element coupled in series with a magnetic memory element, where each memory cell 222 represents one bit of data. FIG. 2B is a simplified schematic diagram of a memory cell 222a, which is one example implementation of memory cells 222 of FIG. 2A.

In an embodiment, memory cell 222a includes a magnetic memory element $M_x$ coupled in series with a selector element $S_x$, both coupled between a first terminal T1 and a second terminal T2. In an embodiment, memory cell 222a is vertically-oriented. In the embodiment of FIG. 2B, magnetic memory element $M_x$ is disposed above selector element $S_x$. In other embodiments, selector element $S_x$ may be disposed above magnetic memory element $M_x$.

In an embodiment, magnetic memory element $M_x$ is a magnetic tunnel junction, and selector element $S_x$ is a threshold selector device. In an embodiment, selector element $S_x$ is a conductive bridge threshold selector device. In other embodiments, selector element $S_x$ is an ovonic threshold switch (e.g., binary SiTe, CTe, BTe, AlTe, etc., or the ternary type AsTeSi, AsTeGe or AsTeGeSiN, etc.), a Metal Insulator Transition (MIT) of a Phase Transition Material type (e.g., $VO_2$, $NbO_2$ etc.), or other similar threshold selector device.

In an embodiment, magnetic memory element $M_x$ includes an upper ferromagnetic layer 230, a lower ferromagnetic layer 232, and a tunnel barrier (TB) 234 which is an insulating layer between the two ferromagnetic layers. In this example, lower ferromagnetic layer 232 is a free layer (FL) that has a direction of magnetization that can be switched. Upper ferromagnetic layer 230 is the pinned (or fixed) layer (PL) that has a direction of magnetization that is not easily changed.

In other embodiments, magnetic memory element $M_x$ may include fewer, additional, or different layers than those depicted in FIG. 2B. In other embodiments, lower ferromagnetic layer 232 is a pinned layer (PL) and upper ferromagnetic layer 230 is the free layer (FL).

When the direction of magnetization in free layer 232 is parallel to that of pinned layer 230, memory element $M_x$ has a relatively low resistance (referred to herein as the "P state"), and when the direction of magnetization in free layer 232 is anti-parallel to that of pinned layer 230, memory element $M_x$ has a relatively high resistance (referred to herein as the "AP state").

In an embodiment, the data state ("0" or "1") of magnetic memory element $M_x$ is read by measuring the resistance of magnetic memory element $M_x$. By design, both the parallel and anti-parallel configurations remain stable in the quiescent state and/or during a read operation (at sufficiently low read current).

In an embodiment, selector element $S_x$ is an ovonic threshold switch that includes a first region 236 and optionally includes a second region 238 disposed above first region 236. In an embodiment, first region 236 is a SiTe alloy, and optional second region 238 is carbon nitride. Other materials may be used for first region 236 and optional second region 238. In other embodiments, selector element $S_x$ is a conductive bridge threshold selector element. In an embodiment, first region 236 is a solid electrolyte region, and second region 238 is an ion source region.

Figure 2C:
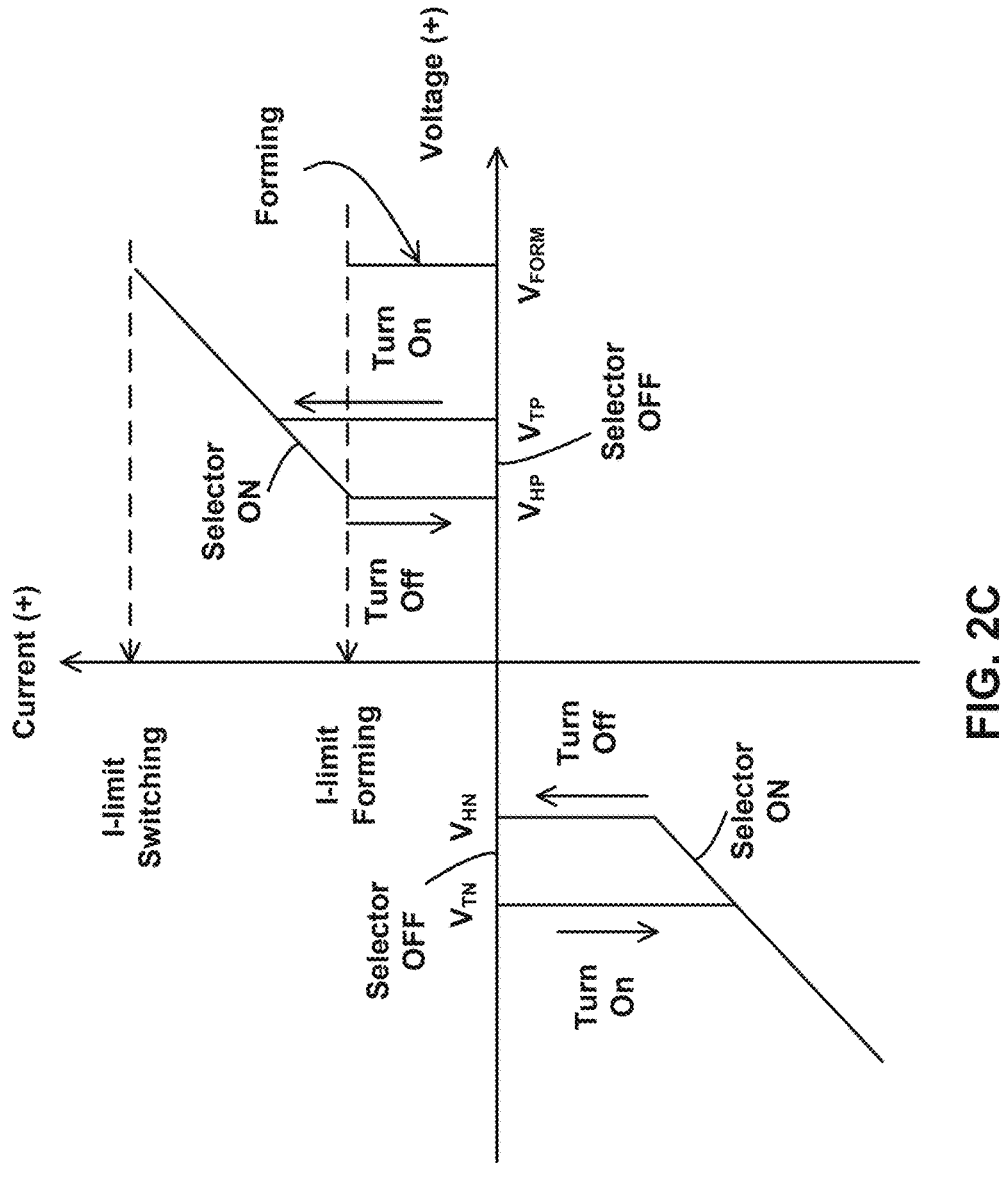
FIG. 2C depicts an example current-voltage characteristic of a threshold selector device of FIG. 2B.
Figure 2B:
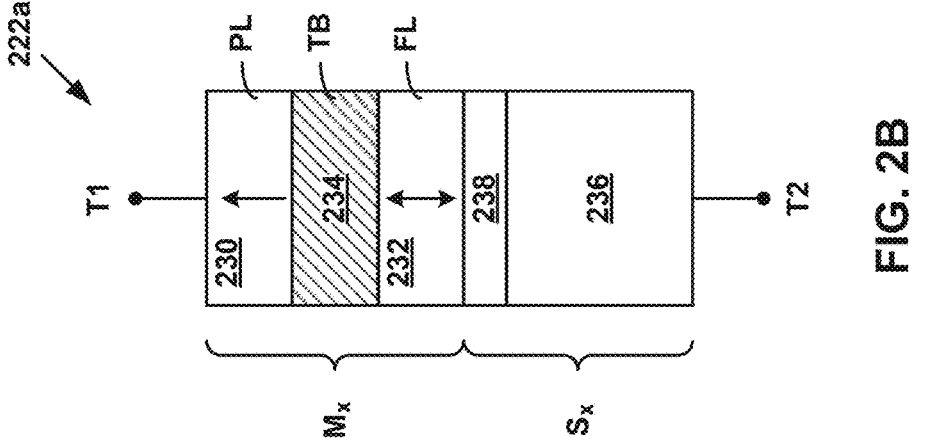
FIG. 2B depicts an embodiment of a memory cell of the three-dimensional memory array of FIG. 2A.

FIG. 2C is a diagram depicting example current-voltage (I-V) characteristics of a threshold selector device $S_x$. Each threshold selector device $S_x$ is initially in a high resistance (OFF) state. To operate threshold selector device $S_x$ as a threshold switch, an initial forming operation may be necessary so that threshold selector device $S_x$ operates in a current range in which switching can occur.

For example, a forming operation may include applying to threshold selector device $S_x$ one or more voltage pulses each having a magnitude greater than or equal to a forming voltage $V_{FORM}$. Following the forming operation, threshold selector device $S_x$ may be switched ON and OFF, and may be used as either a unipolar or a bipolar threshold selector device. Accordingly, threshold selector device $S_x$ may be referred to as a bipolar threshold selector device.

In the example I-V characteristics of FIG. 2C, for positive applied voltages, threshold selector device $S_x$ remains in a high resistance state (HRS) (e.g., OFF) until the voltage across the device meets or exceeds (i.e., is more positive than) a first threshold voltage, $V_{TP}$, at which point threshold selector device $S_x$ switches to a low resistance state (LRS) (e.g., ON). Threshold selector device $S_x$ remains turned ON until the voltage across the device drops to or below a first hold voltage, $V_{HP}$, at which point threshold selector device 224 turns OFF.

For negative applied voltages, threshold selector device $S_x$ remains in a HRS (e.g., OFF) until the voltage across the device meets or exceeds (i.e., is more negative than) a second threshold voltage, $V_{TN}$, at which point threshold selector device 304 switches to a LRS (e.g., ON). Threshold selector device $S_x$ remains turned ON until the voltage across the device increases to or exceeds (i.e., is less negative than) a second hold voltage, $V_{HN}$, at which point threshold selector device $S_x$ turns OFF.

Referring again to FIG. 2B, in an embodiment, magnetic memory element $M_x$ uses spin-transfer-torque (STT) switching. To "set" a bit value of magnetic memory element $M_x$ (i.e., choose the direction of the free layer magnetization), an electrical write current is applied from first terminal T1 to second terminal T2. The electrons in the write current become spin-polarized as they pass through pinned layer 230 because pinned layer 230 is a ferromagnetic metal.

A substantial majority of the conduction electrons in a ferromagnet will have a spin orientation that is parallel to the direction of magnetization, yielding a net spin polarized current. (Electron spin refers to angular momentum, which is directly proportional to but anti-parallel in direction to the magnetic moment of the electron, but this directional distinction will not be used going forward for ease of discussion.)

When the spin-polarized electrons tunnel across TB 234, conservation of angular momentum can result in the imparting of a torque on both free layer 232 and pinned layer 230, but this torque is inadequate (by design) to affect the direction of magnetization of pinned layer 230. Contrastingly, this torque is (by design) sufficient to switch the direction of magnetization of free layer 232 to become parallel to that of pinned layer 230 if the initial direction of magnetization of free layer 232 was anti-parallel to pinned layer 230. The parallel magnetizations will then remain stable before and after such write current is turned OFF.

In contrast, if free layer 232 and pinned layer 230 magnetizations are initially parallel, the direction of magnetization of free layer 232 can be STT-switched to become anti-parallel to that of pinned layer 230 by applying a write current of opposite direction to the aforementioned case. Thus, by way of the same STT physics, the direction of the magnetization of free-layer 232 can be deterministically set into either of two stable orientations by judicious choice of the write current direction (polarity).

In the example described above, spin-transfer-torque (STT) switching is used to "set" a bit value of magnetic memory element $M_x$. In other embodiments, field-induced switching, spin orbit torque (SOT) switching, VCMA (magnetoelectric) switching, or other switching techniques may be employed.

Figure 3A:
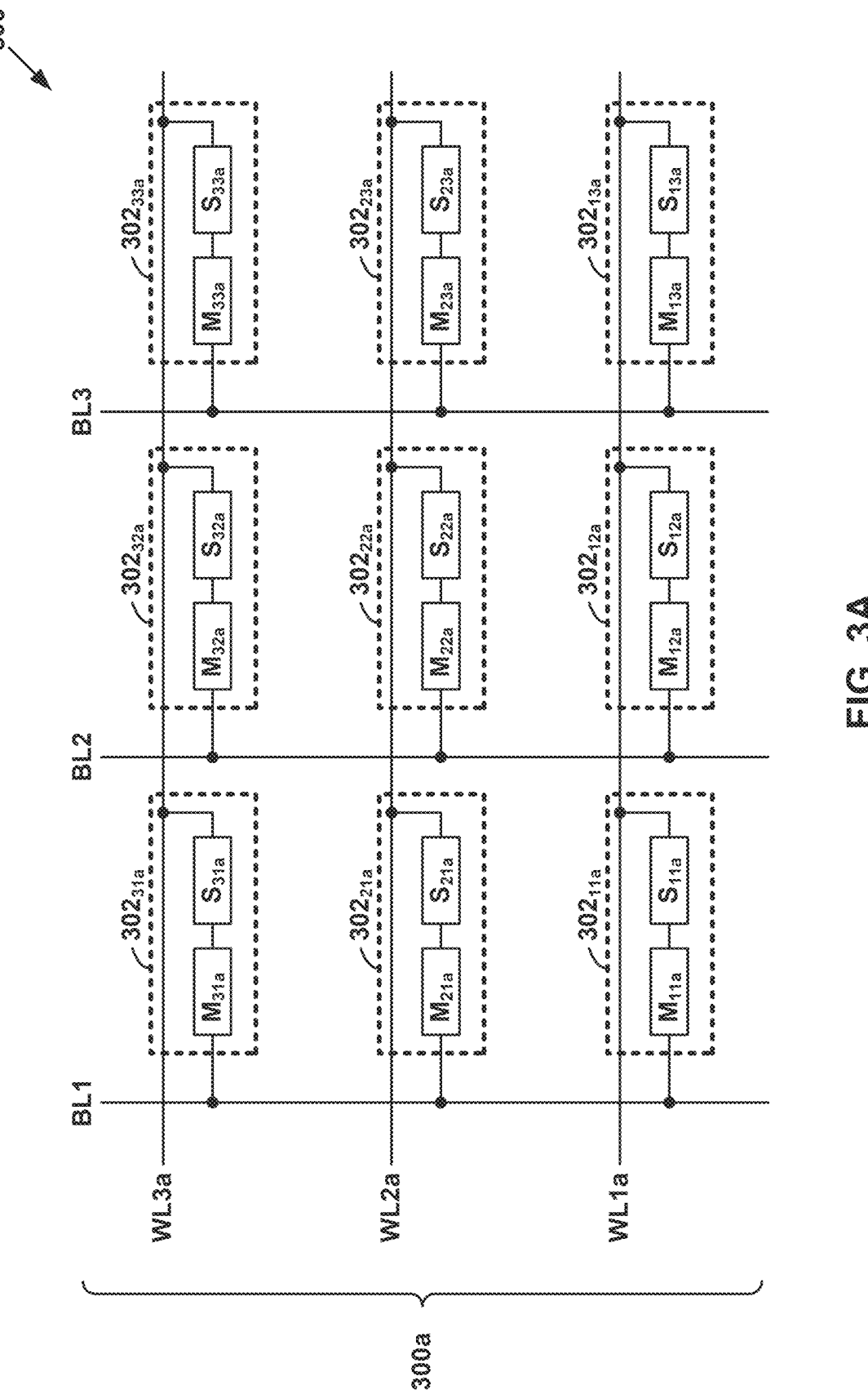
FIGS. 3A-3B depict an embodiment of a cross-point memory array.
Figure 3B:
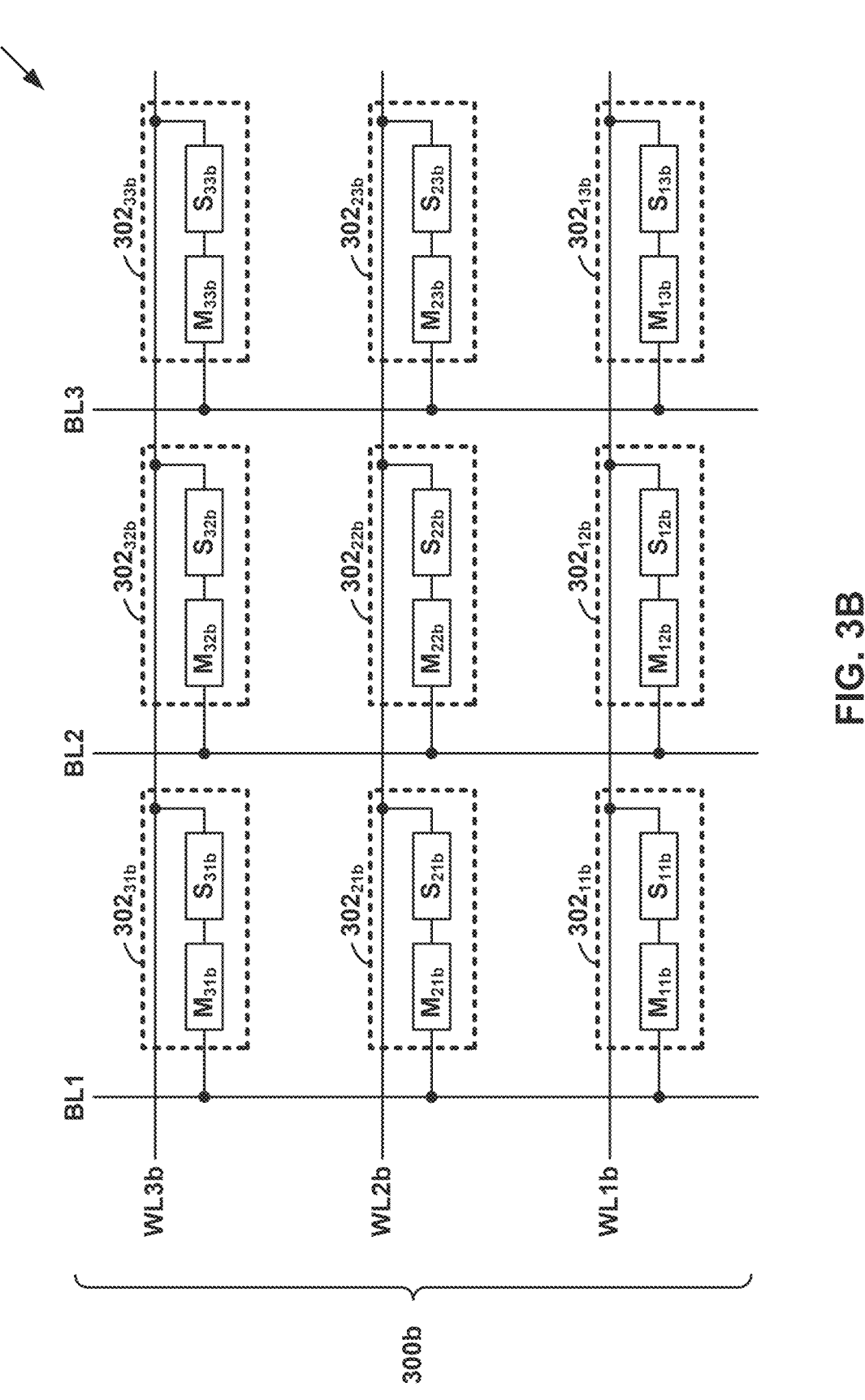

FIGS. 3A-3B are simplified schematic diagrams of an example cross-point memory array 300 which includes a first memory level 300a, and a second memory level 300b positioned above first memory level 300a. Cross-point memory array 300 is an example of an implementation of memory array 160 in FIG. 1E. Cross-point memory array 300 may include more than two memory levels.

Cross-point memory array 300 includes word lines WL1a, WL2a, WL3a, WL1b, WL2b, and WL3b, and bit lines BL1, BL2, and BL3. First memory level 300a includes memory cells $302_{11a}$, $302_{12a}$, . . . , $302_{33a}$ coupled to word lines WL1a, WL2a, WL3a and bit lines BL1, BL2, and BL3, and second memory level 300b includes memory cells $302_{11b}$, $302_{12b}$, . . . , $302_{33b}$ coupled to word lines WL1b, WL2b, WL3b and bit lines BL1, BL2, and BL3. In an embodiment, each of memory cells $302_{11a}$, $302_{12a}$, . . . , $302_{33a}$ are vertically-oriented. In an embodiment, each of memory cells $302_{11b}$, $302_{12b}$, . . . , $302_{33b}$ are vertically-oriented.

First memory level 300a is one example of an implementation for first memory level 212 of monolithic three-dimensional memory array 210 of FIG. 2A, and second memory level 300b is one example of an implementation for second memory level 214 of monolithic three-dimensional memory array 210 of FIG. 2A. In an embodiment, each of memory cells $302_{11a}$, $302_{12a}$, . . . , $302_{33a}$, $302_{11b}$, $302_{12b}$, . . . , $302_{33b}$, is an implementation of memory cell 222a of FIG. 2B.

Persons of ordinary skill in the art will understand that cross-point memory array 300 may include more or less than six word lines, more or less than three bit lines, and more or less than eighteen memory cells $302_{11a}$, $302_{12a}$, . . . , $302_{33a}$, $302_{11b}$, $302_{12b}$, . . . , $302_{33b}$. In some embodiments, cross-point memory array 300 may include 1000×1000 memory cells, although other array sizes may be used.

Each memory cell $302_{11a}$, $302_{12a}$, . . . , $302_{33a}$, $302_{11b}$, $302_{12b}$, . . . , $302_{33b}$ is coupled to one of the word lines and one of the bit lines, and includes a corresponding magnetic memory element $M_{11a}$, $M_{12a}$, . . . , $M_{33a}$, $M_{11b}$, $M_{12b}$, . . . , $M_{33b}$, respectively, coupled in series with a corresponding selector element $S_{11a}$, $S_{12a}$, . . . , $S_{33a}$, $S_{11b}$, $S_{12b}$, . . . , $S_{33b}$, respectively. In an embodiment, each of magnetic memory elements $M_{11a}$, $M_{12a}$, . . . , $M_{33a}$, $M_{11b}$, $M_{12b}$, . . . , $M_{33b}$ is an implementation of magnetic memory element $M_x$ of FIG. 2B, and each of selector elements $S_{11a}$, $S_{12a}$, ..., $S_{33a}$, $S_{11b}$, $S_{12b}$, ..., $S_{33b}$ is an implementation of selector element $S_x$ of FIG. 2B.

Each memory cell $302_{11a}$, $302_{12a}$, ..., $302_{33a}$ has a first terminal coupled to one of bit lines BL1, BL2, BL3, and a second terminal coupled to one of word lines WL1a, WL2a, WL3a, and each memory cell $302_{11b}$, $302_{12b}$, ..., $302_{33b}$ has a first terminal coupled to one of bit lines BL1, BL2, BL3, and a second terminal coupled to one of word lines WL1b, WL2b, WL3b. For example, memory cell 30213a includes magnetic memory element $M_{13a}$ coupled in series with selector element $S_{13a}$, and includes a first terminal coupled to bit line BL3, and a second terminal coupled to word line WL1a.

Likewise, memory cell $302_{22b}$ includes magnetic memory element $M_{22b}$ coupled in series with selector element $S_{22b}$, and includes a first terminal coupled to bit line BL2, and a second terminal coupled to word line WL2b. Similarly, memory cell $302_{33a}$ includes magnetic memory element $M_{33a}$ coupled in series with selector element $S_{33a}$, and includes a first terminal coupled to bit line BL3, and a second terminal coupled to word line WL3a.

Magnetic memory elements $M_{11a}$, $M_{12a}$, ..., $M_{33a}$ may be disposed above or below corresponding selector elements $S_{11a}$, $S_{12a}$, ..., $S_{33a}$, respectively, and magnetic memory elements $M_{11b}$, $M_{12b}$, ..., $M_{33b}$, may be disposed above or below corresponding selector elements $S_{11b}$, $S_{12b}$, ..., $S_{33b}$, respectively.

In an embodiment, the orientation of memory cells $302_{11a}$, $302_{12a}$, ..., $302_{33a}$ of first memory level 300a is the same as the orientation of memory cell $302_{11b}$, $302_{12b}$, ..., $302_{33b}$ of second memory level 300b.

In another embodiment, the orientation of memory cells $302_{11a}$, $302_{12a}$, ..., $302_{33a}$ of first memory level 300a is opposite the orientation of memory cell $302_{11b}$, $302_{12b}$, ..., $302_{33b}$ of second memory level 300b.

Referring again to FIG. 1A, in an embodiment memory core 110 may include one or more two-dimensional arrays of memory cells and/or one or more three-dimensional arrays of memory cells. In an embodiment, memory core 110 may include re-writable memory cells, one-time programmable memory cells, and/or multi-time programmable memory cells, or any combination thereof.

One measure of the performance of one or more memory cells is bit error rate. In an embodiment, a bit error rate for one or more memory cells is determined by writing various data values to the memory cells, reading the written data values from the memory cells, determining the number of times that the read value was not the same as the written value, and then dividing the number of read failures by the total number of reads performed.

Figure 4:
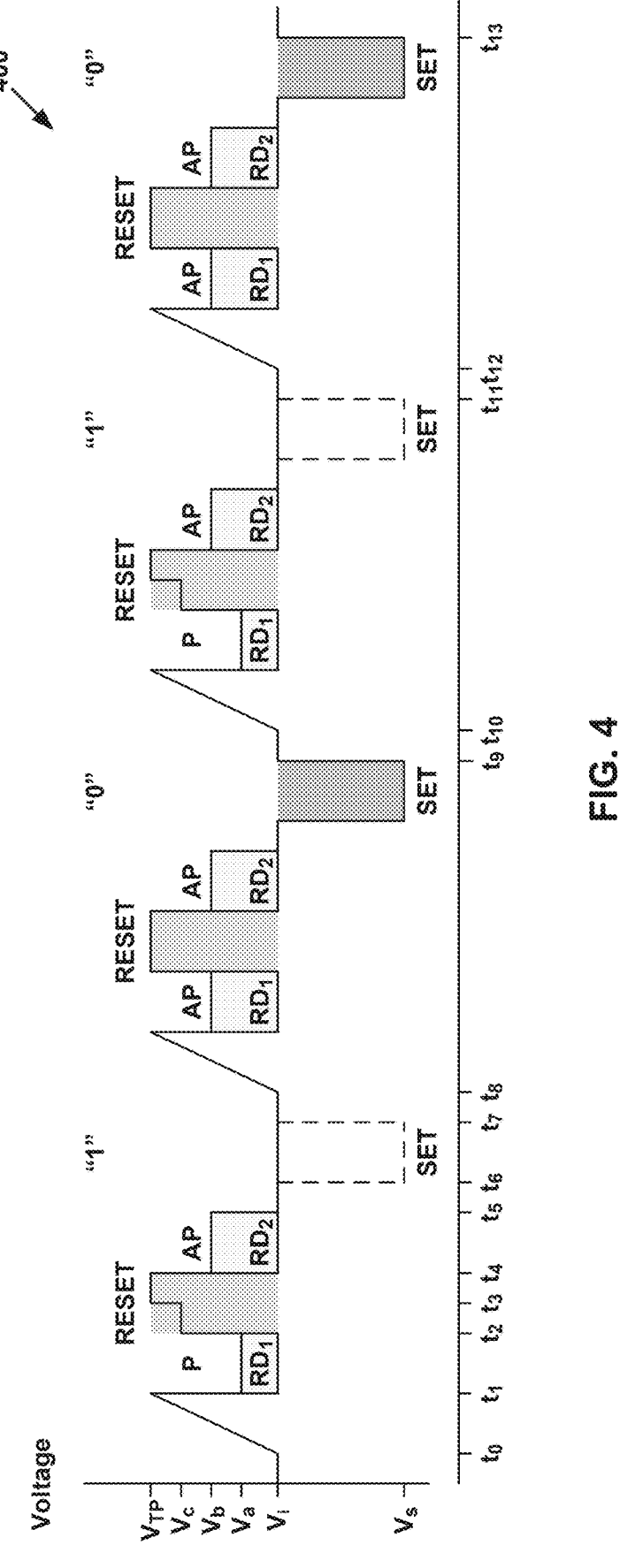
FIG. 4 depicts an example read and write sequence for determining a bit error rate of one or more memory cells in a memory array.

Referring to FIG. 4, an example read and write sequence 400 is depicted for determining a bit error rate for one or more memory cells in a memory array, such as any of memory arrays 160, 174, 176, 200, 202, 204, 206, 210, or 300, described above. In particular, read and write sequence 400 depicts a voltage across a memory cell versus time for a memory cell that includes a selector element coupled in series with a magnetic memory element, such as memory cell 222a of FIG. 2B. For simplicity, the following description will refer to the voltage across the memory cell as the "word line voltage."

As described in more detail below, in the example depicted in FIG. 4 a read operation is performed using a pulse having a first (e.g., positive) polarity, a RESET operation is performed using a pulse having the first polarity, and a SET operation is performed using a pulse having a second (e.g., negative) polarity opposite the first polarity. Persons of ordinary skill in the art will understand that alternatively the first polarity may be negative and the second polarity may be positive.

In an embodiment, the memory cell includes an ovonic threshold switch selector element $S_x$ coupled in series with a magnetic memory element $M_x$. For simplicity, the remaining description will use the phrase ovonic threshold switch $S_x$. Persons of ordinary skill in the at will understand that the principles described below apply to any type of selector element having the same characteristics described below as those of an ovonic threshold switch.

In an embodiment, each read in read and write sequence 400 is a self-referenced read. In an example self-referenced read technique, a memory cell is first read, then written to a first memory state, a second read is performed, and then the results of the first and second read are compared. If the two read results are the same, the memory cell is determined to have originally been in the first memory state and remains in the first memory state. If, however, the two read results are not the same, the memory cell is determined to have originally been in a second memory state but is now in the first memory state.

Referring to 4 and 2B, the symbol "P" indicates that the direction of magnetization of the memory element $M_x$ of the memory cell is parallel to that of pinned layer 230 (and memory element $M_x$ has a relatively low resistance), the symbol "AP" indicates that the direction of magnetization of the memory element $M_x$ of the memory cell is anti-parallel to that of pinned layer 230 (and memory element $M_x$ has a relatively high resistance).

Prior to time $t_0$, the word line voltage is initial voltage $V_i$ (e.g., 0 volts). Between time $t_0$ and time $t_5$, a self-referenced read operation is performed. In particular, beginning at time $t_0$, the word line voltage begins increasing above initial voltage $V_i$. The word line voltage is below first threshold voltage $V_{TP}$, and ovonic threshold switch $S_x$ is OFF.

At time $t_1$, the word line voltage equals first threshold voltage $V_{TP}$, and ovonic threshold switch $S_x$ turns ON. The voltage across ovonic threshold switch $S_x$ drops to a value referred to herein as "$V_{offset}$," and the remaining word line voltage drops across the memory element $M_x$ of the memory cell.

Between time $t_1$ and time $t_2$, a first read operation RD1 is performed. During the first read operation, a current source generates a first current and a current mirror current coupled to current source and the memory cell increases the voltage across the memory cell to deliver the first current through the memory cell. In an embodiment, first current is about 15 µA and has a pulse width of between about 25 nsec and about 50 nsec, although larger or smaller current values and larger or smaller pulse widths may be used. The voltage across the memory cell equals the first current times the resistance of the memory element $M_x$. In the example depicted in FIG. 4, the direction of magnetization of the memory element $M_x$ is P, and the word line voltage has a value $V_a$.

Between times $t_2$ and $t_4$, a RESET pulse is applied to the memory cell to write memory element $M_x$ to a first memory state (AP). During a RESET operation, a current source generates a second current and a current mirror current coupled to current source and the memory cell increases the voltage across the memory cell to deliver the second current through the memory cell. The second current is higher than the first current. In an embodiment, the RESET operation always puts memory element $M_x$ in first memory state AP, and in this regard is referred to as a "destructive read."

The voltage across the memory cell equals the second current times the resistance of the memory element $M_x$. In particular, between time $t_2$ and $t_3$, memory element $M_x$ remains in the P state, and the word line voltage has a value $V_c$. Beginning at time $t_3$, memory element $M_x$ switches to the (higher resistance) AP state, and between times $t_3$ and $t_4$ the word line voltage has a value $V_{TP}$.

At time $t_4$, the RESET pulse ends, memory element $M_x$ is in the AP state, and the word line voltage decreases to voltage $V_b$. Between time $t_4$ and time $t_5$, a second read operation RD2 is performed. During the second read operation, a current source generates the first current and a current mirror current coupled to current source and the memory cell increases the voltage across the memory cell to deliver the first current through the memory cell. In an embodiment, first current is about 15 $\mu$A and has a pulse width of between about 25 nsec and about 50 nsec, although larger or smaller current values and larger or smaller pulse widths may be used.

The voltage across the memory cell equals the first current times the resistance of the memory element $M_x$. In the example depicted in FIG. 4, the direction of magnetization of the memory element $M_x$ is AP, and the word line voltage has a value $V_b$. At time $t_5$ the second read operation ends, the word line voltage returns to initial voltage $V_i$ (e.g., 0 volts) and the ovonic threshold switch turns OFF.

The results of first read RD1 and second read RD2 are compared. If the two read results are the same, memory element $M_x$ is determined to have originally been in first memory state AP and remains in first memory state AP. If, however, the two read results are not the same, memory element $M_x$ is determined to have originally been in a second memory state (P) but is now in first memory state AP.

In the example of FIG. 4, the word line voltage during first read RD1 and second read RD2 are not the same, and thus memory element $M_x$ is determined to have originally been in a second memory state P. Thus, in an embodiment, a second pulse (a SET pulse between time $t_6$ and $t_7$) typically would be used to restore memory element $M_x$ to second memory state P. In FIG. 4, a SET pulse between times $t_6$ and $t_7$ is shown in dashed line to indicate that the SET pulse may or may not be used depending on the operation being performed by read sequence 400.

During a SET operation, a current source generates a third current and a current mirror current coupled to current source and the memory cell increases the voltage across the memory cell to deliver the third current through the memory cell. The third current is opposite polarity to that of the first current and the second current.

The third current is of sufficient magnitude to turn ON the ovonic threshold switch. The voltage across the memory cell equals the third current times the resistance of the memory element $M_x$, and In particular, if a SET pulse is used between times $t_6$ and $t_7$ memory element $M_x$ remains in the AP state, and the word line voltage has a value $V_s$. In an embodiment, during a SET operation the ovonic threshold switch turns ON prior to memory element $M_x$ being written.

The example read and write sequence 400 of FIG. 4 may be used to determine a bit error rate for the memory cell. In particular, a first self-referenced read operation may be performed between times $t_0$-$t_7$, a second self-referenced read operation may be performed between times $t_8$-$t_9$, a third self-referenced read operation may be performed between times $t_{10}$-$t_{11}$, a fourth self-referenced read operation may be performed between times $t_{12}$-$t_{13}$, and so on.

In an embodiment, alternate SET pulses are not applied, so that memory element $M_x$ repeatedly toggles between first memory state AP ("1") and second memory state P ("0"). Because the RESET operation always puts memory element $M_x$ in first memory state AP, we know the values that should be read from the memory cells. The bit error rate is determined by comparing the read values and the expected values, and then determining the number of errors.

Figure 5A:
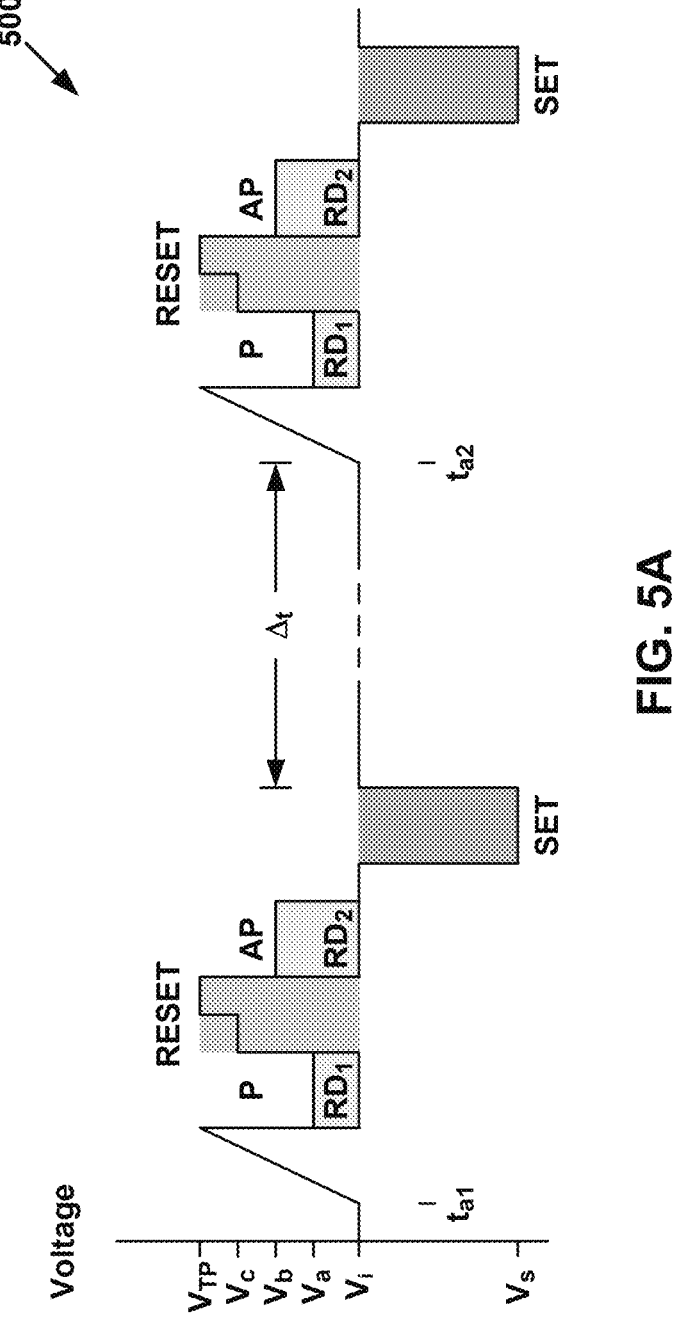
FIG. 5A depicts two successive self-referenced read operations separated by a bit access time.
Figure 5B:
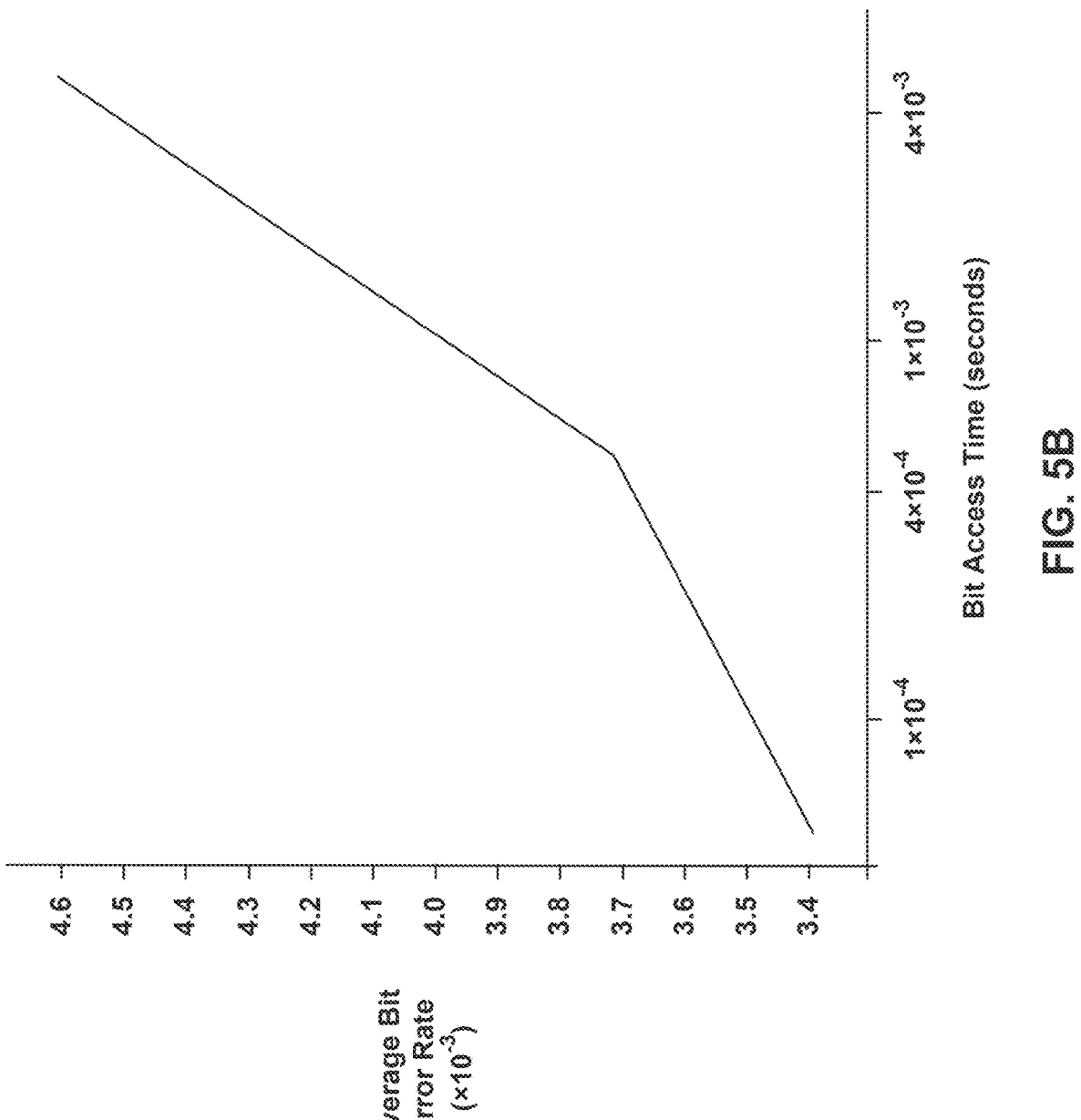
FIG. 5B depicts a diagram showing average bit error rate versus bit access time.

A phenomenon that has been observed using the example read and write sequence 400 of FIG. 4 is that if the time between successive bit access operations increases, the bit error rate increases. For example, FIG. 5A depicts two successive self-referenced read operations separated by a bit access time $\Delta_t$, and FIG. 5B depicts a diagram showing example average bit error rate versus bit access time. As the diagram shows, as bit access time increases, average bit error rate increases.

Without wanting to be bound by any particular theory, it is believed that threshold voltage drift of the memory cell ovonic threshold switch is a cause of the phenomenon of bit error rate increase with increasing bit access time. In particular, some selector elements $S_x$, such as ovonic threshold switches, exhibit a phenomenon of threshold voltage drift. That is, if an ovonic threshold switch is turned ON by applying a voltage across the switch that exceeds the threshold voltage (e.g., first threshold voltage $V_{TP}$ of FIG. 2C), the threshold voltage of the ovonic threshold switch begins to drift higher as time elapses.

Figure 5C:
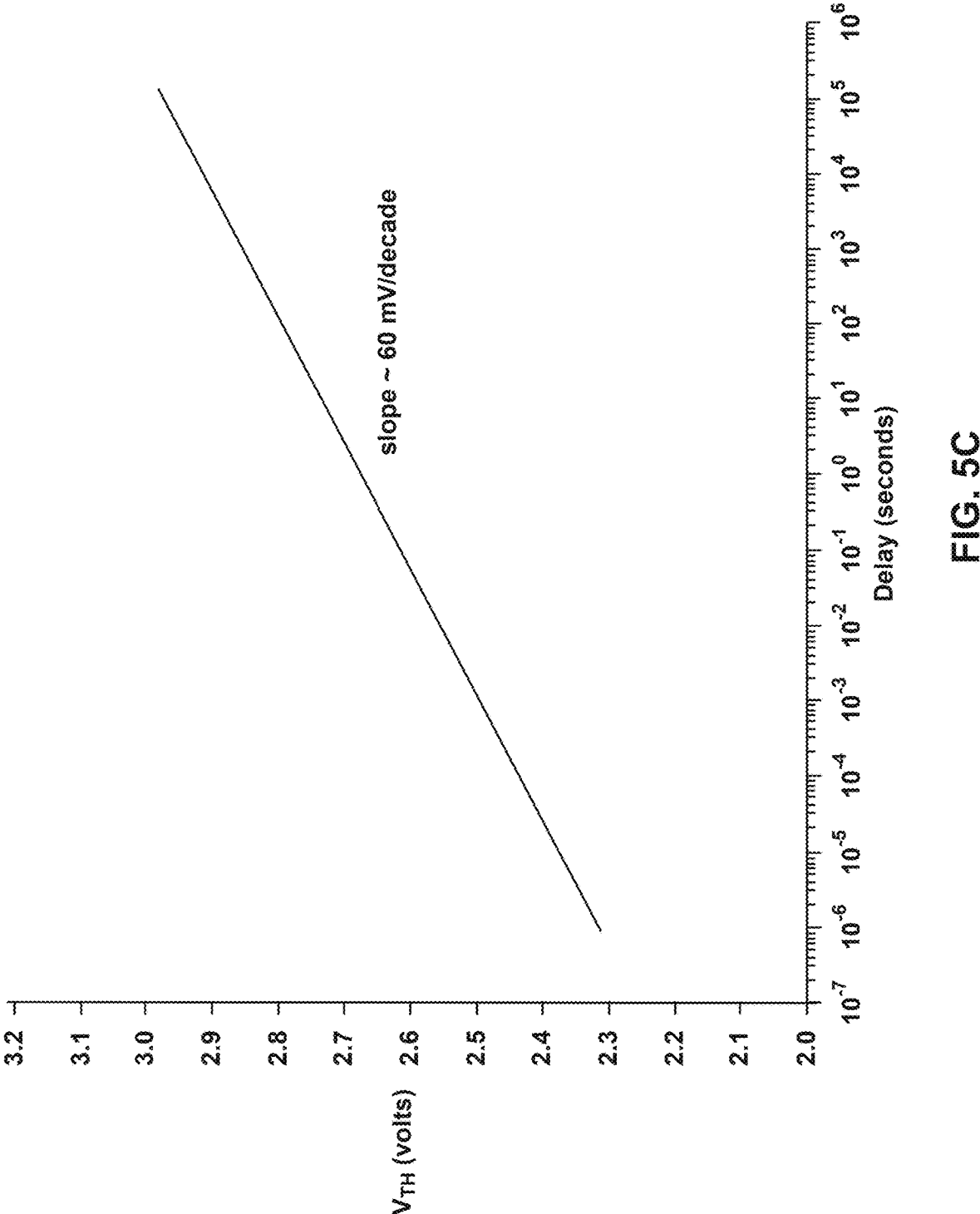
FIG. 5C depicts a diagram of example threshold voltage values versus delay for a population of memory cells.

For example, FIG. 5C depicts a diagram of example threshold voltage $V_{TH}$ values versus delay for a population of memory cells such as memory cell 222a of FIG. 2B in which selector element $S_x$ is an ovonic threshold switch. In this example, the ovonic threshold switch has an initial threshold voltage $V_{TH}$ of about 2.3V. After a delay of about 1 msec, the threshold voltage $V_{TH}$ has a value of about 2.5V. After about 100 sec, the threshold voltage $V_{TH}$ has a value of about 2.8V. In this example diagram, the threshold voltage of the ovonic threshold switch increases at about 60 mV/decade. In the example depicted in FIG. 5C, the threshold voltage $V_{TH}$ values versus delay has a linear relationship. Persons of ordinary skill in the art will understand that threshold voltage $V_{TH}$ values versus delay alternatively may have a non-linear relationship.

A consequence of the threshold voltage drift is that as the delay time increases, the voltage required to turn ON the ovonic threshold switch also increases. As described above, when the ovonic threshold switch turns ON (when the word line voltage equals the threshold voltage $V_{TH}$) the voltage across ovonic threshold switch $S_x$ drops to a value $V_{offset}$, and the remaining word line voltage drops across the memory element $M_x$ of the memory cell.

This remaining voltage is referred to herein as a "snapback voltage" as follows:

$$\text{snapback voltage} = (V_{TH} - V_{offset})$$

The value of $V_{offset}$ does not appear to be impacted by delay, and thus as bit access time increases the snapback voltage increases with the increasing threshold voltage $V_{TH}$.

Without wanting to be bound by any particular theory, it is believed that the increase of snapback voltage with increasing bit access time may disturb the data value stored in the memory element $M_x$ of the memory cell. Indeed, if the snapback voltage becomes sufficiently large the memory element $M_x$ may switch state (e.g., from the P state to the AP state). Without wanting to be bound by any particular theory, it is believed that the increase of snapback voltage with increasing bit access time is a cause of the phenomenon of bit error rate increase with increasing bit access time.

Figure 5D:
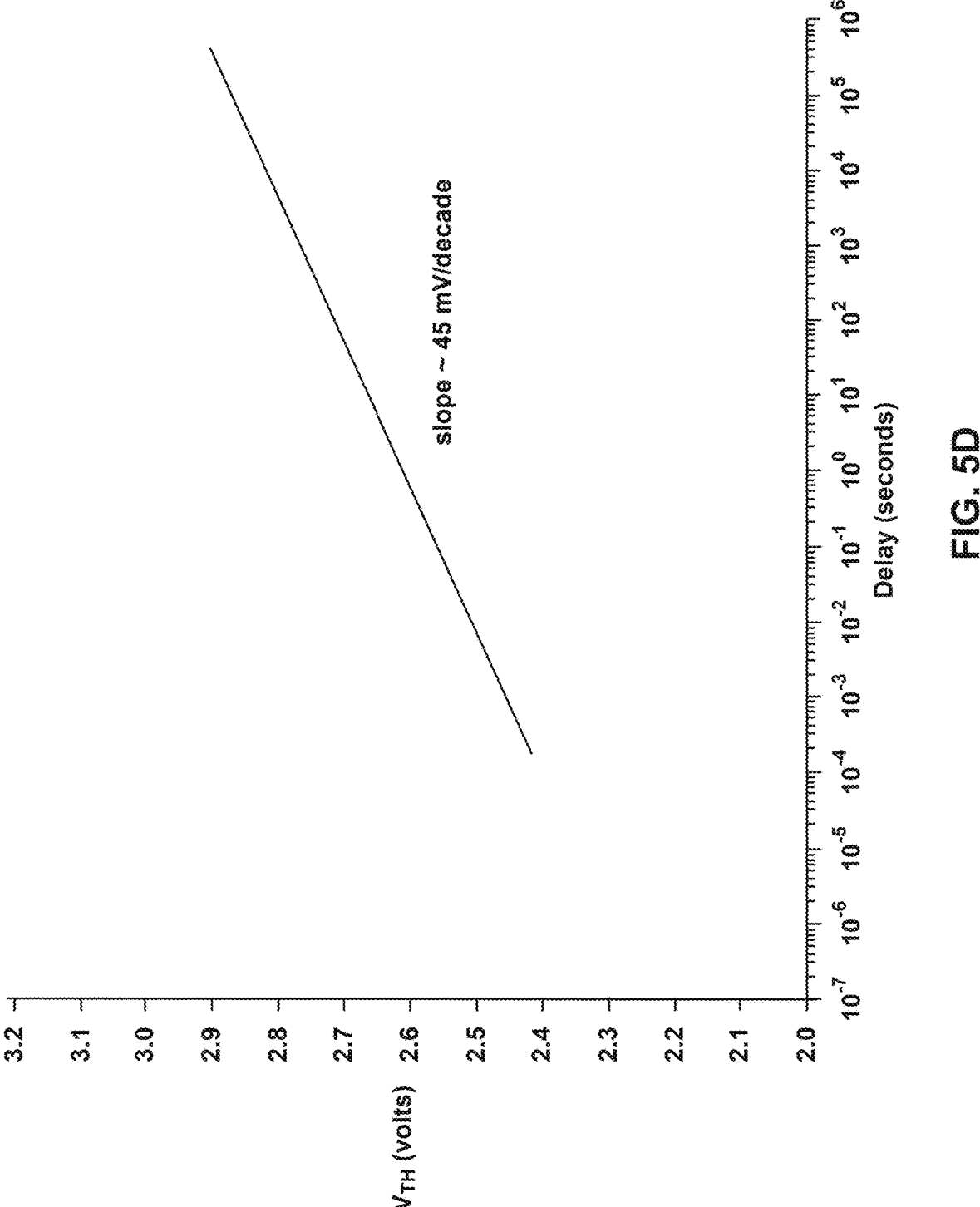
FIG. 5D depicts a diagram of other example threshold voltage values versus delay for a population of memory cells.

FIG. 5D depicts a diagram of other example threshold voltage $V_{TH}$ values versus delay for a population of memory cells such as memory cell 222a of FIG. 2B in which selector element $S_x$ is an ovonic threshold switch. In this example, the ovonic threshold switch has an initial threshold voltage $V_{TH}$ of about 2.4V. After a delay of about 100 msec, the threshold voltage $V_{TH}$ has a value of about 2.5V. After about 100 sec, the threshold voltage $V_{TH}$ has a value of about 2.7V. In this example diagram, the threshold voltage of the ovonic threshold switch increases at about 45 mV/decade. In the example depicted in FIG. 5D, the threshold voltage $V_{TH}$ values versus delay has a linear relationship. Persons of ordinary skill in the art will understand that threshold voltage $V_{TH}$ values versus delay alternatively may have a non-linear relationship.

As described above and depicted in the example of FIG. 4, each read operation is performed using pulses having a first (e.g., positive) polarity, and each SET operation is performed using a pulse having a second (e.g., negative) polarity opposite the first polarity.

As used herein, a pulse used to turn ON an ovonic threshold switch is referred to as an "access pulse." Thus, each read operation is performed after using an access pulse having the first (e.g., positive) polarity (a "positive access pulse"), and each SET operation is performed after using an access pulse having the second (e.g., negative) polarity (a "negative access pulse").

Without wanting to be bound by any particular theory, it is believed that a relationship between the polarity of successive access pulses impacts the rate of threshold voltage drift with increasing bit access time.

Without wanting to be bound by any particular theory, it is believed that the rate of threshold voltage drift with increasing bit access time of an ovonic threshold switch depends on whether successive access pulses have a same polarity or an opposite polarity.

Without wanting to be bound by any particular theory, it is believed that when successive access pulses having a same polarity are used to turn ON an ovonic threshold switch the rate of threshold voltage drift with increasing bit access time is lower than the rate of threshold voltage drift with increasing bit access time when successive access pulses having opposite polarity are used to turn ON an ovonic threshold switch.

Figure 6A:
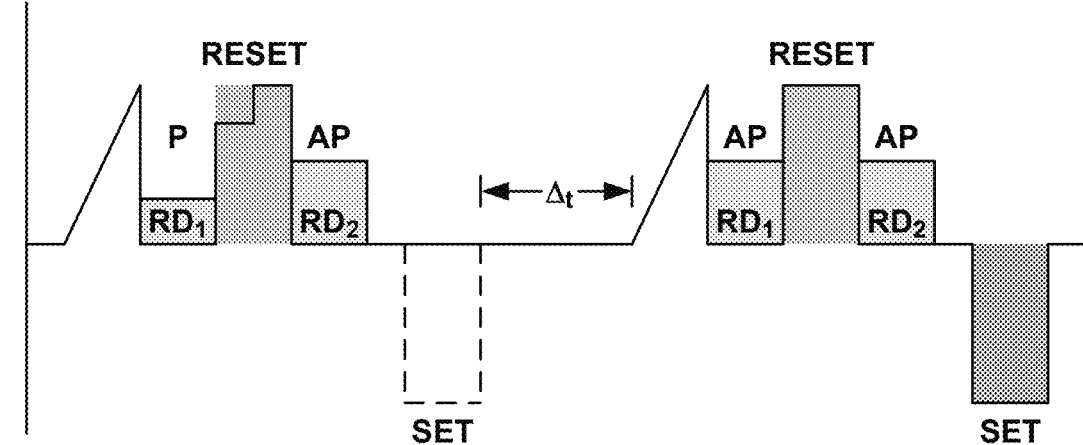
FIG. 6A depicts two successive self-referenced read operations separated by a bit access time interval.
Figure 6B:
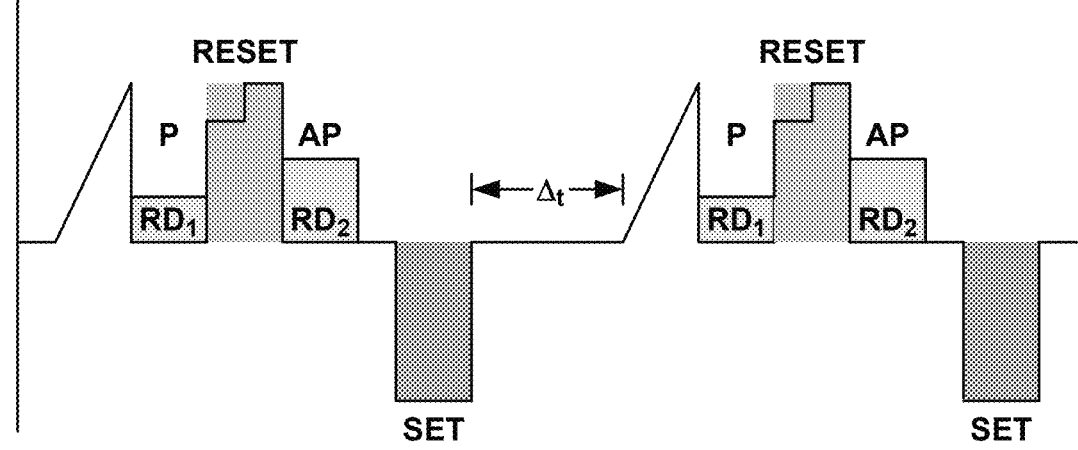
FIG. 6B depicts two alternative successive self-referenced read operations separated by a bit access time interval.

For example, FIGS. 6A and 6B each depict two successive self-referenced read operations separated by bit access time interval $\Delta_t$.

In FIG. 6A, no SET pulse is used after the first self-referenced read. Thus, in the first self-referenced read the ovonic threshold switch is turned ON with a positive access pulse, and then in the second self-referenced read the ovonic threshold switch is turned ON with another positive access pulse. Thus, the ovonic threshold switch is turned ON with two successive access pulses of the same polarity.

In contrast, in FIG. 6B a SET pulse is used after the first self-referenced read. The SET pulse has a negative polarity that turns ON the ovonic threshold switch $S_x$ and also changes the direction of magnetization of the memory element $M_x$ from AP to P. In the second self-referenced read the ovonic threshold switch is turned ON with a positive access pulse. Thus, the ovonic threshold switch is turned ON with two successive access pulses of different polarity.

Empirical data has shown that the rate of threshold voltage drift with increasing bit access time varies depending on the relationship between the polarity of successive access pulses used to turn ON an ovonic threshold switch. Indeed, without wanting to be bound by any particular theory, it is believed that if an ovonic threshold switch is turned ON with two successive access pulses of the same polarity, the rate of threshold voltage drift with increasing bit access time is less than if the ovonic threshold switch is turned ON with two successive access pulses of different polarity.

For example, an ovonic threshold switch that is turned ON with two successive access pulses of the same polarity (e.g., such as depicted in FIG. 6A) may exhibit a first rate of threshold voltage drift with increasing bit access time (e.g., 45 mv/dec, such as shown in FIG. 5D).

In contrast, an ovonic threshold switch that is turned ON with two successive access pulses of opposite polarity (e.g., such as depicted in FIG. 6B) may exhibit a second rate of threshold voltage drift with increasing bit access time (e.g., 60 mv/dec, such as shown in FIG. 5C). In an embodiment, the first rate of threshold voltage drift is lower than the second rate of threshold voltage drift.

Empirical data also has shown that the magnitude of the threshold voltage varies depending on the relationship between the polarity of successive access pulses used to turn ON an ovonic threshold switch. Indeed, without wanting to be bound by any particular theory, it is believed that if an ovonic threshold switch is turned ON with two successive access pulses of the same polarity, the magnitude of the threshold voltage will remain substantially constant, whereas if the ovonic threshold switch is turned ON with two successive access pulses of different polarity the magnitude of the threshold voltage can increase, and this in turn may increase the snapback voltage.

Technology is described for managing the impact of threshold voltage drift of an ovonic threshold switch selector element. In particular, technology is described for managing the impact of threshold voltage drift of an ovonic threshold switch selector element on the bit error rate of memory cells that include such ovonic threshold switches. Without wanting to be bound by any particular theory, it is believed that this technology may be used to reduce the impact of threshold voltage drift of an ovonic threshold switch selector element on the bit error rate of memory cells that include such ovonic threshold switches.

Figure 7:
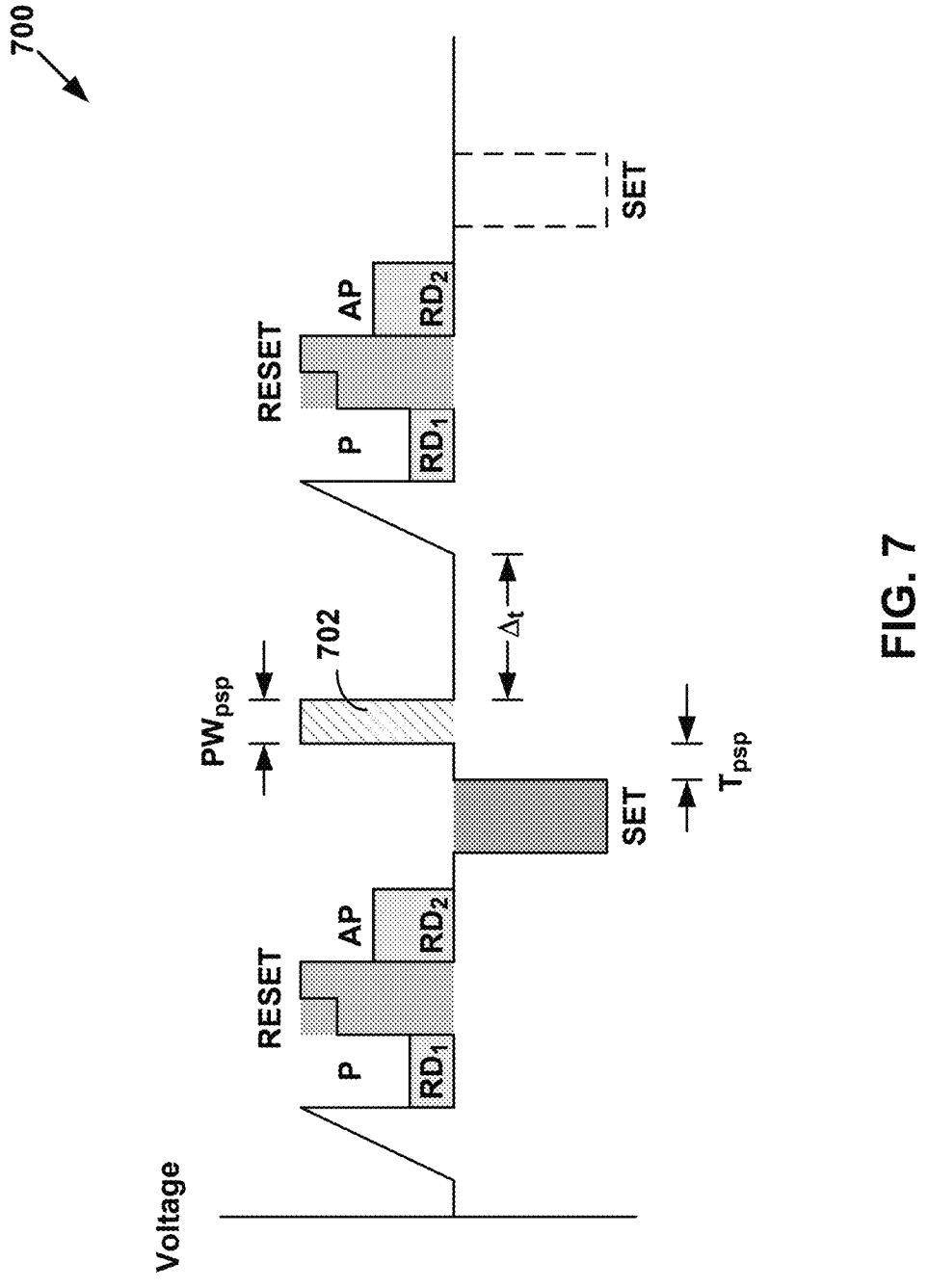
FIG. 7 depicts an embodiment of a read and write sequence of this technology.

FIG. 7 depicts an embodiment of technology to manage the impact of threshold voltage drift of an ovonic threshold switch selector element. In particular, read and write sequence 700 depicts a voltage across a memory cell versus time for a memory cell that includes a selector element coupled in series with a magnetic memory element, such as memory cell 222a of FIG. 2B. In an embodiment, the selector element is an ovonic threshold switch.

In the embodiment of FIG. 7, a self-referenced read operation is performed, and a SET pulse is used if the read results indicate that the magnetic memory element was originally in the P state prior to the RESET operation. In an embodiment, after each SET pulse, a post-set pulse 702 having the same polarity (e.g., positive) as that of the read operations is performed.

In an embodiment, a current source generates a fourth current, and a current mirror current coupled to current source and the memory cell increases the voltage across the memory cell to deliver the fourth current through the memory cell to generate post-set pulse 702.

In an embodiment, post-set pulse 702 should be short enough not to significantly impact latency but long enough to turn ON the ovonic threshold switch. In an embodiment, post-set pulse 702 should not disturb the state of the magnetic memory element.

In an embodiment, post-set pulse 702 is generated by a fourth current that is between about 5 µA to about 20 µA, although larger or smaller current values may be used. Alternatively, post-set pulse 702 may have a maximum voltage of between about 3V to about 4V, although larger or smaller maximum voltage values may be used.

In an embodiment, post-set pulse 702 has a pulse width $PW_{psp}$. In an embodiment, pulse width $PW_{psp}$ is between about 5 nsec and about 40 nsec, although larger or smaller pulse widths may be used.

In an embodiment, post-set pulse 702 is applied at a time $T_{psp}$ after each SET pulse. In an embodiment, time $T_{psp}$ is a short as possible. In an embodiment, time $T_{psp}$ is less than about 1 µsec. In an embodiment, time $T_{psp}$ is less than about 100 nsec. In an embodiment, time $T_{psp}$ is about zero seconds.

In the embodiment depicted in FIG. 7, a single post-set pulse 702 is used after each SET pulse. In other embodiments, more than one post-set pulse 702 may be used. In an embodiment, a post-set pulse is only used after a SET pulse. For example, as depicted in FIG. 7 the second self-referenced read is not followed by a SET pulse, and thus no post-set pulse is used following the second self-referenced read.

Without wanting to be bound by any particular theory, it is believed that using post-set pulses such as example post-set pulse 702 after each SET pulse may result in a lower rate of threshold voltage drift with increasing bit access time compared to the rate of threshold voltage drift with increasing bit access time that would have occurred without including the post-set pulses. In this regard, without wanting to be bound by any particular theory, it is believed that using post-set pulses such as example post-set pulse 702 after each SET pulse may reduce a rate of threshold voltage drift with increasing bit access time.

Without wanting to be bound by any particular theory, it is believed that using post-set pulses such as example post-set pulse 702 after each SET pulse may result in a rate of threshold voltage drift with increasing bit access time is less than it would otherwise be if post-set pulses were not used.

Without wanting to be bound by any particular theory, it is believed that using post-set pulses such as example post-set pulse 702 after each SET pulse may reduce the threshold voltage magnitude compared to what the threshold voltage magnitude would otherwise be if post-set pulses were not used.

Without wanting to be bound by any particular theory, it is believed that using post-set pulses such as example post-set pulse 702 after each SET pulse may reduce the impact of threshold voltage drift of an ovonic threshold switch selector element on the bit error rate of memory cells that include such ovonic threshold switches.

Use of post-set pulses such as example post-set pulse 702 does not eliminate threshold voltage drift with increasing bit access time. Indeed, the threshold voltage will still drift over time. But by reducing the rate of threshold voltage drift with increasing bit access time the technique may reduce the amount of threshold voltage drift that does occur.

Figure 8:
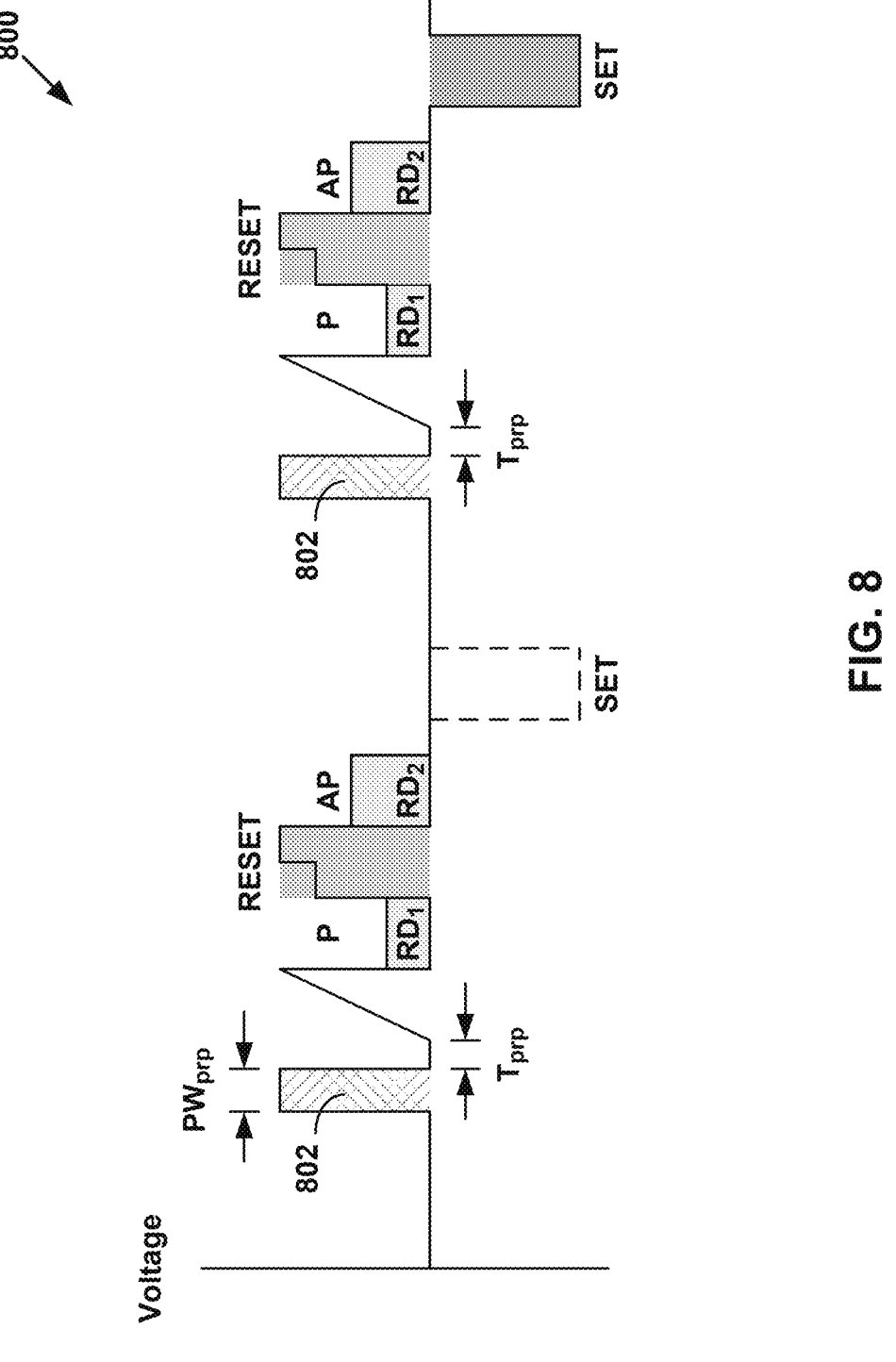
FIG. 8 depicts another embodiment of a read and write sequence of this technology.

FIG. 8 depicts another embodiment of technology to manage the impact of threshold voltage drift of an ovonic threshold switch selector element. In particular, read and write sequence 800 depicts a voltage across a memory cell versus time for a memory cell that includes a selector element coupled in series with a magnetic memory element, such as memory cell 222a of FIG. 2B. In an embodiment, the selector element is an ovonic threshold switch.

In the embodiment of FIG. 8, a self-referenced read operation is performed, and a SET pulse may or may not be used following the read operation. In an embodiment, prior to each self-referenced read operation, a pre-read pulse 802 having the same polarity (e.g., positive) as that of the read operations is performed.

In an embodiment, a current source generates a fifth current, and a current mirror current coupled to current source and the memory cell increases the voltage across the memory cell to deliver the fifth current through the memory cell to generate pre-read pulse 802.

In an embodiment, pre-read pulse 802 should be short enough not to significantly impact latency but long enough to turn ON the ovonic threshold switch. In an embodiment, pre-read pulse 802 should not disturb the state of the magnetic memory element.

In an embodiment, pre-read pulse 802 is generated by a fifth current that is between about 5 pA to about 20 µA, although larger or smaller current values may be used. Alternatively, pre-read pulse 802 may have a maximum voltage of between about 3V to about 4V, although larger or smaller maximum voltage values may be used.

In an embodiment, pre-read pulse 802 has a pulse width $PW_{prp}$. In an embodiment, pulse width $PW_{prp}$ is between about 5 nsec and about 40 nsec, although larger or smaller pulse widths may be used.

In an embodiment, pre-read pulse 802 is applied at a time $T_{prp}$ before each self-referenced read. In an embodiment, time $T_{prp}$ is a short as possible. In an embodiment, time $T_{prp}$ is less than about 1 µsec. In an embodiment, time $T_{prp}$ is less than about 100 nsec. In an embodiment, time $T_{prp}$ is about zero seconds.

In the embodiment depicted in FIG. 8, a single pre-read pulse 802 is used before each self-referenced read. In other embodiments, more than one pre-read pulse 802 may be used. In an embodiment, a pre-read pulse 802 is used regardless of whether a SET pulse preceded the self-referenced read. For example, as depicted in FIG. 8 the second self-referenced read is not followed by a SET pulse, but a pre-read pulse 802 is used before the second self-referenced read.

Without wanting to be bound by any particular theory, it is believed that using pre-read pulses such as example pre-read pulse 802 before each self-referenced read operation may substantially reduce or eliminate the threshold voltage drift that occurred prior to the pre-read pulse 802.

Figure 9:
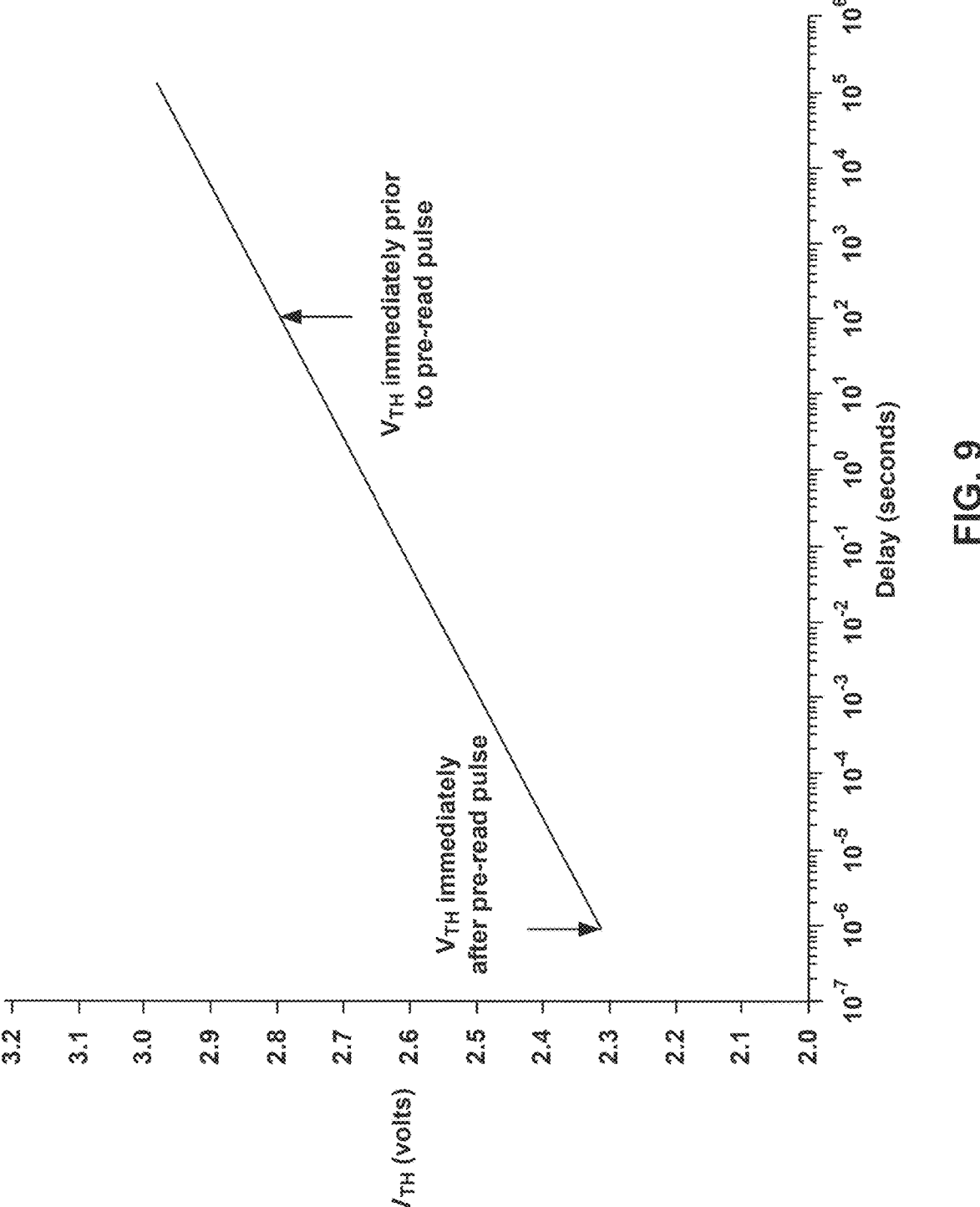
FIG. 9 depicts a diagram of still other example threshold voltage values versus delay for a population of memory cells.

For example, FIG. 9 depicts a diagram of example threshold voltage $V_{TH}$ values versus delay for a population of memory cells such as memory cell 222a of FIG. 2B in which selector element $S_x$ is an ovonic threshold switch. In this diagram, assume that 100 seconds of delay had elapsed immediately prior to pre-read pulse 802, and that the threshold voltage $V_{TH}$=2.8 volts. When pre-read pulse 802 turns ON the ovonic threshold switch, the threshold voltage $V_{TH}$ is substantially reset to the value at essentially no delay (e.g., $V_{TH}$=2.3 volts).

Without wanting to be bound by any particular theory, it is believed that using pre-read pulses such as example pre-read pulse 802 before each self-referenced read operation may reduce the impact of threshold voltage drift of an ovonic threshold switch selector element on the bit error rate of memory cells that include such ovonic threshold switches.

In particular, without wanting to be bound by any particular theory, it is believed that pre-read pulses such as example pre-read pulse 802 may "absorb" the snapback voltage. Indeed, without wanting to be bound by any particular theory it is believed that when the amplitude of pre-read pulse 802 reaches the threshold voltage $V_{TH}$ of the ovonic threshold switch, the switch turns ON and the snapback voltage starts to discharge.

Without wanting to be bound by any particular theory it is believed that by making pulse width $PW_{prp}$ of pre-read pulse 802 sufficiently short, the ovonic threshold switch turns OFF and the snapback voltage discharges (e.g., to GROUND). In this regard, without wanting to be bound by any particular theory, it is believed that pre-read pulses such as example pre-read pulse 802 may "absorb" the snapback voltage and may prevent disturb of the memory element $M_x$.

As described above, in an embodiment a current source generates a fifth current, and a current mirror current coupled to current source and the memory cell increases the voltage across the memory cell to deliver the fifth current through the memory cell to generate pre-read pulse 802.

In an embodiment, each memory cell is coupled to a word line that in turn is coupled to various circuitry such as drivers, decoders and other circuitry collectively referred to herein as "external circuitry." The external circuitry disadvantageously adds a capacitive load to the word line.

In an embodiment, a transistor having a control gate is coupled between the word line and the external circuitry, and a gate control signal having a voltage ($VG_{CON}$) coupled to the control gate may be used to selectively connect and disconnect the external circuitry to the word line. For example, if $VG_{CON}$ has a first value (LOW), the transistor turns ON and connects the external circuitry to the word line, and if $VG_{CON}$ has a second value (HIGH), the transistor turns OFF and essentially disconnects the external circuitry from the word line.

Figure 10:
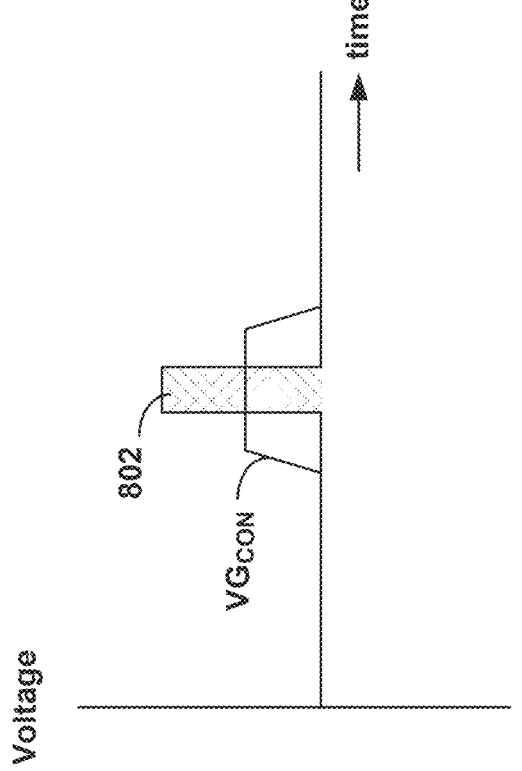
FIG. 10 depicts an embodiment of a gate control signal superimposed over a pre-read pulse.

In an embodiment, gate control signal $VG_{CON}$ can be used to further enhance the effect of pre-read pulse 802. For example, FIG. 10 depicts an embodiment of a control signal $VG_{CON}$ superimposed over a pre-read pulse 802. In the depicted embodiment, control signal $VG_{CON}$ goes HIGH (thereby essentially disconnecting the external circuitry from the word line) just prior to pre-read pulse 802 and goes LOW (thereby connecting the external circuitry to the word line).

Without wanting to be bound by any particular theory, it is believed that by utilizing gate control signal $VG_{CON}$ in this manner, the capacitive loading on the word line can be reduced while pre-read pulse 802 is applied to the word line, and may decrease the time required to discharge the snapback voltage (e.g., to GROUND).

Persons of ordinary skill in the art will understand that gate control signal $VG_{CON}$ may have values other than LOW and HIGH. For example, $VG_{CON}$ may have values that result in the transistor being neither fully ON or fully OFF. Without wanting to be bound by any particular theory, it is believed that such gate control signal values $VG_{CON}$ may likewise reduce capacitive loading on the word line while pre-read pulse 802 is applied to the word line, and may decrease the time required to discharge the snapback voltage (e.g., to GROUND).

In addition, without wanting to be bound by any particular theory, it is believed that gate control signal $VG_{CON}$ also may be used as described above while post set pulse (e.g., post-set pulse 702 of FIG. 7) is applied to the word line, and may decrease the time required to discharge the snapback voltage (e.g., to GROUND).

As described above, pre-read pulse 802 is applied at a time $T_{prp}$ before each self-referenced read. In an embodiment, time $T_{prp}$ is a short as possible, and ideally time $T_{prp}$ is zero. However, if time $T_{prp}=0$, the ovonic threshold switch may not completely turn OFF, and the snapback voltage may not completely discharge. As a result, some residual portion of the snapback voltage may disturb the memory element $M_x$.

Figure 11:
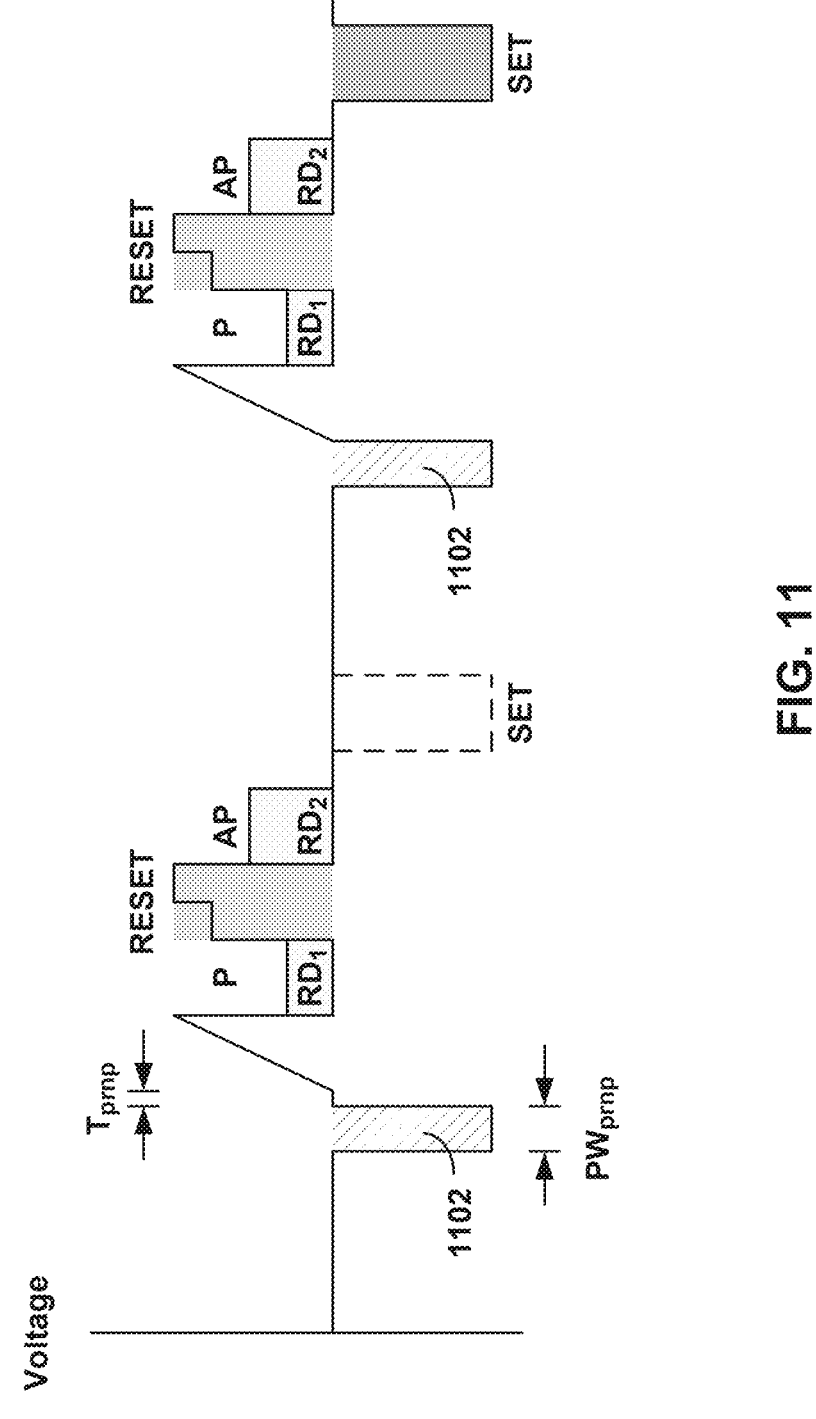
FIG. 11 depicts still another embodiment of a read and write sequence of this technology.

FIG. 11 depicts still another embodiment of technology to manage the impact of threshold voltage drift of an ovonic threshold switch selector element. In particular, read and write sequence 1100 depicts a voltage across a memory cell versus time for a memory cell that includes a selector element coupled in series with a magnetic memory element, such as memory cell 222a of FIG. 2B. In an embodiment, the selector element is an ovonic threshold switch.

In the embodiment of FIG. 11, a self-referenced read operation is performed, and a SET pulse may or may not be used following the read operation. In an embodiment, prior to each self-referenced read operation, a pre-read pulse 1102 having an opposite polarity (e.g., negative) as that of the read operations is performed.

In an embodiment, a current source generates a sixth current, and a current mirror current coupled to current source and the memory cell increases the magnitude of the voltage across the memory cell to deliver the sixth current through the memory cell to generate pre-read pulse 1102.

In an embodiment, pre-read pulse 1102 should be short enough not to significantly impact latency but long enough to turn ON the ovonic threshold switch. In an embodiment, pre-read pulse 1102 should not disturb the state of the magnetic memory element.

In an embodiment, pre-read pulse 1102 is generated by a sixth current that is between about 5 μA to about 20 μA, although larger or smaller current values may be used. Alternatively, pre-read pulse 1102 may have a maximum voltage magnitude of between about 3V to about 4V, although larger or smaller maximum voltage values may be used.

In an embodiment, pre-read pulse 1102 has a pulse width $PW_{prnp}$. In an embodiment, pulse width $PW_{prnp}$ is between about 5 nsec and about 15 nsec, although larger or smaller pulse widths may be used.

In an embodiment, pre-read pulse 1102 is applied at a time $T_{prnp}$ before each self-referenced read. In an embodiment, time $T_{prnp}$ is a short as possible. In an embodiment, time $T_{prnp}=0$.

In the embodiment depicted in FIG. 11, a single pre-read pulse 1102 is used before each self-referenced read. In other embodiments, more than one pre-read pulse 1102 may be used. In an embodiment, a pre-read pulse 1102 is used regardless of whether a SET pulse preceded the self-referenced read. For example, as depicted in FIG. 11 the second self-referenced read is not followed by a SET pulse, but a pre-read pulse 1102 is used before the second self-referenced read.

Without wanting to be bound by any particular theory, it is believed that using pre-read pulses such as example pre-read pulse 1102 before each self-referenced read operation may substantially reduce or eliminate the threshold voltage drift that occurred prior to the pre-read pulse 1102.

Without wanting to be bound by any particular theory, it is believed that using pre-read pulses such as example pre-read pulse 1102 before each self-referenced read operation may reduce the impact of threshold voltage drift of an ovonic threshold switch selector element on the bit error rate of memory cells that include such ovonic threshold switches.

In particular, without wanting to be bound by any particular theory, it is believed that pre-read pulses such as example pre-read pulse 1102 may "absorb" the snapback voltage. Indeed, without wanting to be bound by any particular theory it is believed that when the amplitude of pre-read pulse 1102 reaches the threshold voltage $V_{TH}$ of the ovonic threshold switch, the switch turns ON and the snapback voltage starts to discharge.

However, without wanting to be bound by any particular theory it is believed that by making pulse width $PW_{pmp}$ of pre-read pulse 1102 sufficiently short, the ovonic threshold switch turns OFF and the snapback voltage discharges (e.g., to GROUND). In this regard, without wanting to be bound by any particular theory, it is believed that pre-read pulses such as example pre-read pulse 1102 may "absorb" the snapback voltage and may prevent disturb of the memory element $M_x$.

Further, without wanting to be bound by any particular theory, it is believed that in contrast to pre-read pulse 802 of FIG. 8, pre-read pulse 1102 can be created such that pre-read pulse 1102 directly abuts the start of the self-referenced read (i.e., time $T_{pmp}$=0). In particular, without wanting to be bound by any particular theory it is believed that by using a negative polarity pre-read pulse 1102 and a positive polarity access pulse for the self-referenced read, the ovonic threshold switch must turn OFF from pre-read pulse 1102 before turning ON again at the start of the self-referenced read. Thus, without wanting to be bound by any particular theory it is believed that the snapback voltage may be fully discharged even when pre-read pulse 1102 directly abuts the start of the self-referenced read.

Figure 12:
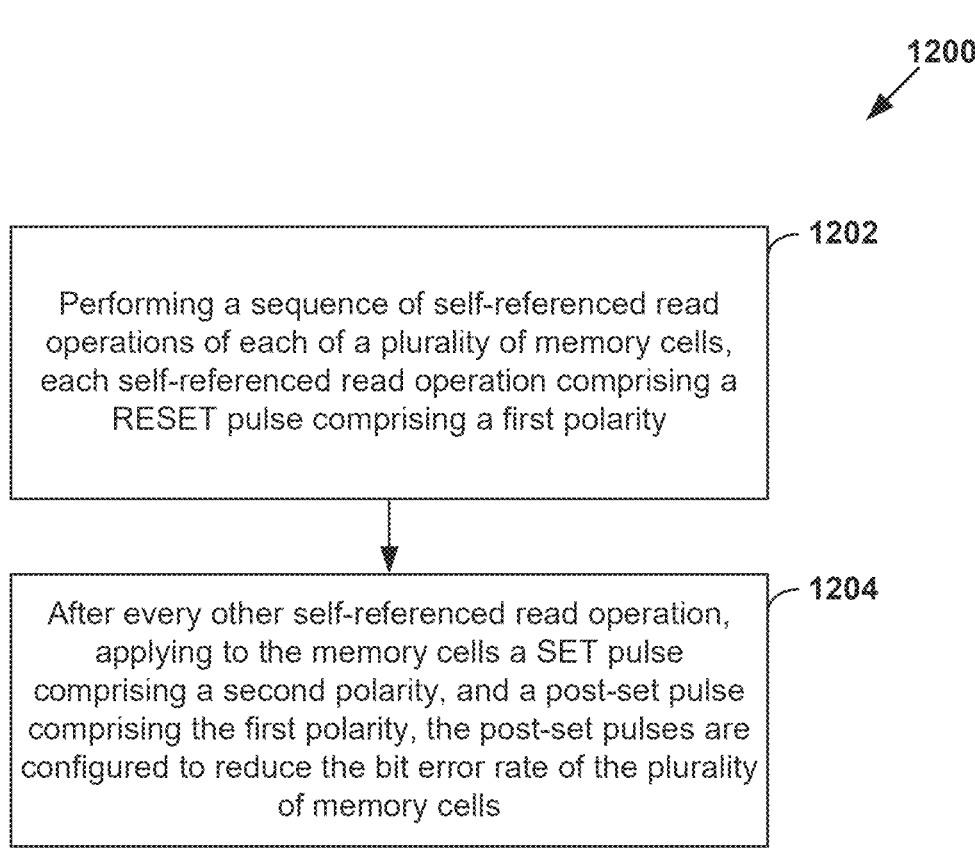
FIG. 12 is a flow chart of an embodiment of a method for determining a bit error rate of a plurality of memory cells.

Referring now to FIG. 12, an embodiment of a method 1200 for determining a bit error rate of a plurality of memory cells, each comprising an ovonic threshold switch coupled in series with a magnetic memory element, is described.

At step 1202, performing a sequence of self-referenced read operations of each of the memory cells, each self-referenced read operation including a RESET pulse having a first polarity.

At step 1204, after every other self-referenced read operation, applying to the memory cells a SET pulse including a second polarity, and a post-set pulse having the first polarity. In an embodiment, the post-set pulses are configured to reduce the bit error rate of the plurality of memory cells.

Referring now to FIG. 13, an embodiment of a method 1300 for determining a bit error rate of a plurality of memory cells, each comprising an ovonic threshold switch coupled in series with a magnetic memory element, is described.

At step 1302, performing a sequence of self-referenced read operations of each of the memory cells, each self-referenced read operation including a RESET pulse having a first polarity.

At step 1304, prior to each self-referenced read operation, applying to the memory cells a pulse having the first polarity to turn ON the ovonic threshold switch without disturbing a data state of the corresponding magnetic memory element. The pre-read pulses are configured to reduce the bit error rate of the plurality of memory cells.

Referring now to FIG. 14, an embodiment of a method 1400 for determining a bit error rate of a plurality of memory cells, each comprising an ovonic threshold switch coupled in series with a magnetic memory element, is described.

At step 1402, performing a sequence of self-referenced read operations of each of the memory cells, each self-referenced read operation comprising a RESET pulse comprising a first polarity.

At step 1404, prior to each self-referenced read operation, applying to the memory cells a pulse comprising a second polarity opposite the first polarity to turn ON the ovonic threshold switch without disturbing a data state of the corresponding magnetic memory element. The pre-read pulses are configured to reduce the bit error rate of the plurality of memory cells.

The technology described above has been described with respect to self-referenced read operations. Persons of ordinary skill in the art will understand that the described technology also may be used with other read techniques, such as non-destructive read techniques (sometimes referred to as "fast read" techniques).

One embodiment of the disclosed technology includes an apparatus that includes a memory cell and a control circuit coupled to the memory cell. The memory cell includes a reversible resistance-switching memory element coupled in series with a selector element that has a threshold voltage. The control circuit is configured to use a first pulse having a first polarity to first access the memory cell, use a second pulse having a second polarity opposite the first polarity to second access the memory cell, and use a third pulse having the first polarity to third access the memory cell. The third pulse is configured to reduce a rate of threshold voltage drift of the selector element.

One embodiment of the disclosed technology includes an apparatus that includes a cross-point memory array and a control circuit coupled to cross-point memory array. The cross-point memory array includes a plurality of memory cells, each memory cell including a magnetic tunnel junction memory element coupled in series with a selector element. The control circuit is configured to perform a self-referenced read operation of each of the plurality of memory cells, and for each memory cell that changed from a first direction of magnetization to a second direction of magnetization as a result of the self-referenced read operation apply a SET pulse to change direction of magnetization from the second direction of magnetization to the first direction of magnetization, and apply a post-set pulse including a polarity opposite the polarity of the SET pulse.

One embodiment of the disclosed technology includes a method that includes determining a bit error rate of a plurality of memory cells, each including an ovonic threshold switch coupled in series with a magnetic memory element, by: performing a sequence of self-referenced read operations of each of the memory cells, each self-referenced read operation including a RESET pulse comprising a first polarity, and after every other self-referenced read operation, applying to the memory cells a SET pulse including a second polarity, and a post-set pulse comprising the first polarity. The post-set pulses are configured to reduce the bit error rate of the plurality of memory cells.

One embodiment of the disclosed technology includes an apparatus that includes a memory cell and a control circuit coupled to the memory cell. The memory cell includes a reversible resistance-switching memory element coupled in series with a selector element that comprises a threshold voltage. The control circuit is configured to use a first pulse having a first polarity to first access the memory cell, and use a second pulse having the first polarity to second access the memory cell and read the memory cell. The first pulse is configured to reduce a rate of threshold voltage drift of the selector element.

One embodiment of the disclosed technology includes an apparatus that includes an apparatus that includes a cross-point memory array and a control circuit coupled to cross-point memory array. The cross-point memory array includes a plurality of memory cells, each memory cell including a magnetic tunnel junction memory element coupled in series with a selector element. The control circuit is configured to perform a self-referenced read operation of each of the plurality of memory cells, and prior to each self-referenced read operation, apply a pre-read pulse to reset a threshold voltage of the corresponding selector element.

One embodiment of the disclosed technology includes a method that includes determining a bit error rate of a plurality of memory cells, each comprising an ovonic threshold switch coupled in series with a magnetic memory element, by performing a sequence of self-referenced read operations of each of the memory cells, each self-referenced read operation including a RESET pulse having a first polarity, and prior to each self-referenced read operation, applying to the memory cells a pulse having the first polarity to turn ON the ovonic threshold switch without disturbing a data state of the corresponding magnetic memory element. The pre-read pulses are configured to reduce the bit error rate of the plurality of memory cells.

One embodiment of the disclosed technology includes an apparatus that includes a memory cell and a control circuit coupled to the memory cell. The memory cell includes a reversible resistance-switching memory element coupled in series with a selector element that comprises a threshold voltage. The control circuit is configured to use a first pulse comprising a first polarity to first access the memory cell, and use a second pulse comprising a second polarity opposite the first polarity to second access the memory cell and read the memory cell, the second pulse abutting the first pulse. The first pulse is configured to reduce a rate of threshold voltage drift of the selector element.

One embodiment of the disclosed technology includes an apparatus that includes a cross-point memory array including a plurality of memory cells and a control circuit coupled to cross-point memory array. Each memory cell includes a magnetic tunnel junction memory element coupled in series with a selector element. The control circuit is configured to perform a self-referenced read operation of each of the plurality of memory cells, and prior to each self-referenced read operation, apply a pre-read pulse that is configured to discharge a voltage difference between a threshold voltage and an offset voltage of the corresponding selector element.

One embodiment of the disclosed technology includes a method that includes determining a bit error rate of a plurality of memory cells, each comprising an ovonic threshold switch coupled in series with a magnetic memory element. The method includes performing a sequence of self-referenced read operations of each of the memory cells, each self-referenced read operation comprising a RESET pulse comprising a first polarity, and prior to each self-referenced read operation, applying to the memory cells a pulse comprising a second polarity opposite the first polarity to turn ON the ovonic threshold switch without disturbing a data state of the corresponding magnetic memory element. The pre-read pulses are configured to reduce the bit error rate of the plurality of memory cells.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus comprising:
a memory cell comprising a reversible resistance-switching memory element coupled in series with a selector element that comprises a threshold voltage; and
a control circuit coupled to the memory cell, the control circuit configured to:
use a first pulse comprising a first polarity to first access the memory cell; and
use a second pulse comprising a second polarity opposite the first polarity to second access the memory cell and read the memory cell, the second pulse abutting the first pulse,
wherein the first pulse is configured to reduce a rate of threshold voltage drift of the selector element.

2. The apparatus of claim 1, wherein the reversible resistance-switching memory element comprises a magnetic memory element.

3. The apparatus of claim 1, wherein the reversible resistance-switching memory element comprises a magnetic tunnel junction.

4. The apparatus of claim 1, wherein the selector element comprises a threshold selector device.

5. The apparatus of claim 1, wherein the selector element comprises an ovonic threshold switch.

6. The apparatus of claim 1, wherein the selector element comprises a threshold voltage that drifts at an increasing rate with time.

7. The apparatus of claim 1, wherein the selector element may be selectively turned ON.

8. The apparatus of claim 1, wherein the first pulse and the second pulse each turn ON the selector element.

9. The apparatus of claim 1, wherein the control circuit is further configured to perform a first read and a second read of the reversible resistance-switching memory element after the second pulse.

10. The apparatus of claim 1, wherein the control circuit is further configured to perform a destructive read of the reversible resistance-switching memory element after the second pulse.

11. The apparatus of claim 1, wherein the second pulse comprises a RESET pulse.

12. The apparatus of claim 1, wherein the first pulse is configured to turn ON the selector element without disturbing a data state of the reversible resistance-switching memory element.

13. The apparatus of claim 1, wherein the first pulse configured to reduce a bit error rate of the memory cell.

14. An apparatus comprising:

a cross-point memory array comprising a plurality of memory cells, each memory cell comprising a magnetic tunnel junction memory element coupled in series with a selector element;

a control circuit coupled to cross-point memory array, the control circuit configured to:

perform a self-referenced read operation of each of the plurality of memory cells; and prior to each self-referenced read operation, apply a pre-read pulse that is configured to discharge a voltage difference between a threshold voltage and an offset voltage of the corresponding selector element, wherein the pre-read pulse is configured to reduce a bit error rate of the plurality of memory cells.

15. The apparatus of claim 14, wherein each selector element comprises a threshold selector device.

16. The apparatus of claim 14, wherein each selector element comprises an ovonic threshold switch.

17. The apparatus of claim 14, wherein each selector element comprises a threshold voltage that drifts at an increasing rate with time.

18. A method comprising:

determining a bit error rate of a plurality of memory cells, each comprising an ovonic threshold switch coupled in series with a magnetic memory element, by:

performing a sequence of self-referenced read operations of each of the memory cells, each self-referenced read operation comprising a RESET pulse comprising a first polarity; and prior to each self-referenced read operation, applying to the memory cells a pulse comprising a second polarity opposite the first polarity to turn ON the ovonic threshold switch without disturbing a data state of the corresponding magnetic memory element, wherein the pre-read pulses are configured to reduce the bit error rate of the plurality of memory cells.

19. The method of claim 18, wherein the magnetic memory elements each comprise a magnetic tunnel junction.

\* \* \* \* \*